(12) United States Patent
Ma et al.

(10) Patent No.: US 12,225,805 B2
(45) Date of Patent: Feb. 11, 2025

(54) DISPLAY PANEL

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Weitao Ma, Beijing (CN); Lu Yang, Beijing (CN); Chengchung Yang, Beijing (CN)

(73) Assignees: CHENGDU BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/754,056

(22) PCT Filed: Mar. 26, 2021

(86) PCT No.: PCT/CN2021/083320
§ 371 (c)(1),
(2) Date: Mar. 22, 2022

(87) PCT Pub. No.: WO2022/198646
PCT Pub. Date: Sep. 29, 2022

(65) Prior Publication Data
US 2024/0049581 A1     Feb. 8, 2024

(51) Int. Cl.
*H10K 59/80* (2023.01)
*H10K 59/122* (2023.01)
*H10K 59/38* (2023.01)

(52) U.S. Cl.
CPC ....... *H10K 59/8792* (2023.02); *H10K 59/122* (2023.02); *H10K 59/38* (2023.02)

(58) Field of Classification Search
CPC ... H10K 59/8792; H10K 59/122; H10K 59/38
(Continued)

(56) References Cited

U.S. PATENT DOCUMENTS

2016/0133675 A1*  5/2016  Yata .................... H10K 59/353
                                                                257/89
2018/0053815 A1   2/2018  Lee et al.
(Continued)

FOREIGN PATENT DOCUMENTS

CN        108231851 A      6/2018
CN        108766995 A     11/2018
(Continued)

OTHER PUBLICATIONS

English translation of International Search Report dated Dec. 7, 2021, for corresponding PCT Application No. PCT/CN2021/083320.

*Primary Examiner* — Quoc D Hoang
(74) *Attorney, Agent, or Firm* — Kinney & Lange, P.A.

(57) ABSTRACT

A display panel includes: a substrate; a plurality of sub-pixels; an encapsulation layer; a light shielding layer which is located on a side of the encapsulation layer away from the substrate and is provided with a plurality of openings corresponding to the plurality of sub-pixels respectively; a first color film layer including a plurality of basic units covering the plurality of openings in the light shielding layer respectively; and a second color film layer which is located on a side of the first color film layer away from the substrate and includes a plurality of overlay units covering an edge of at least one basic unit of the plurality of basic units respectively. A color of the basic unit is different form a color of the overlay unit covering the basic unit.

20 Claims, 17 Drawing Sheets

(58) Field of Classification Search
USPC .......................................................... 257/91
See application file for complete search history.

(56) References Cited

U.S. PATENT DOCUMENTS

| | | | |
|---|---|---|---|
| 2021/0098743 A1 | 4/2021 | Li et al. | |
| 2021/0313400 A1* | 10/2021 | Bae | H10K 59/38 |
| 2021/0367015 A1* | 11/2021 | Kim | H10K 59/123 |
| 2021/0408131 A1 | 12/2021 | Huang et al. | |
| 2022/0158136 A1 | 5/2022 | Yang et al. | |

FOREIGN PATENT DOCUMENTS

| | | | |
|---|---|---|---|
| CN | 110323262 A | 10/2019 |
| CN | 110504381 A | 11/2019 |
| CN | 110610978 A | 12/2019 |
| CN | 110707132 A | 1/2020 |
| CN | 111129092 A | 5/2020 |
| CN | 111162110 A | 5/2020 |
| CN | 111326636 A | 6/2020 |
| CN | 112216209 A | 1/2021 |
| CN | 112216210 A | 1/2021 |
| CN | 112271202 A | 1/2021 |
| CN | 112420956 A | 2/2021 |

\* cited by examiner

DISPLAY PANEL

CROSS-REFERENCE TO RELATED APPLICATION(S)

The present application is a Section 371 National Stage Application of International Application No. PCT/CN2021/083320, filed on Mar. 26, 2021, entitled "DISPLAY PANEL", which is incorporated herein by reference in its entirety.

TECHNICAL FIELD

The present disclosure relates to a field of display technology, and in particular, to a display panel.

BACKGROUND

Color Film on Encapsulation (COE) technology is a technology that replaces a polarizer with a color film and a black matrix manufactured on an encapsulation layer. However, if ambient light irradiates a surface of a display panel manufactured based on this technology when the display panel is not lit, a color separation phenomenon will occur, causing color stripes to appear on the display panel.

SUMMARY

According to one aspect of the present disclosure, a display panel is provided, including:
a substrate,
a plurality of sub-pixels on a side of the substrate;
an encapsulation layer on a side of the plurality of sub-pixels away from the substrate, wherein the encapsulation layer covers the plurality of sub-pixels;
a light shielding layer on a side of the encapsulation layer away from the substrate, wherein the light shielding layer is provided with a plurality of openings corresponding to the plurality of sub-pixels respectively;
a first color film layer including a plurality of basic units covering the plurality of openings in the light shielding layer respectively; and
a second color film layer on a side of the first color film layer away from the substrate, wherein the second color film layer includes a plurality of overlay units covering an edge of at least one basic unit of the plurality of basic units respectively, wherein a color of the basic unit is different form a color of the overlay unit covering the basic unit.

For example, the plurality of basic units includes at least one red basic unit, at least one green basic unit and at least one blue basic unit, and the plurality of overlay units includes at least one first blue overlay unit corresponding to the at least one red basic unit respectively and at least one second blue overlay unit corresponding to the at least one green basic unit respectively, wherein,
at least a part of an edge of the red basic unit is covered by the first blue overlay unit corresponding to the red basic unit; and
at least a part of an edge of the green basic unit is covered by the second blue overlay unit corresponding to the green basic unit.

For example, a projection of the red basic unit on the substrate has a shape of polygon, the red basic unit includes a plurality of edges connected in sequence, and two edges of the plurality of edges are parallel to each other; and the first blue overlay unit includes a first blue sub-unit and a second blue sub-unit, and the first blue overlay unit covers two edges of the red basic unit which are parallel to each other.

For example, the projection of the red basic unit on the substrate has a shape of hexagon, and the red basic unit has a first edge, a second edge, a third edge, a fourth edge, a fifth edge and a sixth edge connected in sequence, wherein the first edge and the fourth edge are parallel to each other and have a first length, and the second edge, the third edge, the fifth edge and the sixth edge have a second length less than the first length; and
the first blue overlay unit includes the first blue sub-unit and the second blue sub-unit, the first blue sub-unit covers the first edge of the red basic unit, and the second blue sub-unit covers the fourth edge of the red basic unit.

For example, the plurality of overlay units further includes at least one green overlay unit corresponding to the at least one red basic unit respectively, the green overlay unit includes a first green overlay unit and a second green overlay unit, the first green overlay unit covers the second edge and the third edge of the red basic unit, and the second green overlay unit covers the fifth edge and the sixth edge of the red basic unit.

For example, the first blue sub-unit extends along the first edge of the red basic unit in a strip shape, and at least a part of the first blue sub-unit covers the first edge of the red basic unit; and
the second blue sub-unit extends along the fourth edge of the red basic unit in a strip shape, and at least a part of the second blue sub-unit covers the fourth edge of the red basic unit.

For example, the first blue sub-unit has a width in a range of 3 µm to 10 µm in a direction perpendicular to an extending direction of the first blue sub-unit, and a part of the first blue sub-unit covering the red basic unit has a width in a range of 1 µm to 8 µm in the direction perpendicular to the extending direction of the first blue sub-unit;
the second blue sub-unit has a width in a range of 3 µm to 10 µm in a direction perpendicular to an extending direction of the second blue sub-unit, and a part of the second blue sub-unit covering the red basic unit has a width perpendicular to the extending direction in a range of 1 µm to 8 µm.

For example, the green basic unit includes a first green sub-portion and a second green sub-portion, each of a projection of the first green sub-portion on the substrate and a projection of the second green sub-portion on the substrate has a shape of pentagons, each of the first green sub-portion and the second green sub-portion has a first edge, a second edge, a third edge, a fourth edge and a fifth edge connected in sequence, and
wherein the second blue overlay unit includes a third blue sub-unit and a fourth blue sub-unit, the third blue sub-unit covers at least one of the first edge, the second edge, the third edge, the fourth edge and the fifth edge of the first green sub-portion, and the fourth blue sub-unit covers at least one of the first edge, the second edge, the third edge, the fourth edge and the fifth edge of the second green sub-portion.

For example, in each of the first green sub-portion and the second green sub-portion, the first edge and the third edge are parallel, the second edge is perpendicular to the first edge and the third edge, and an angle between the fourth edge and the third edge is equal to an angle between the fifth edge and the first edge;

the first green sub-portion and the second green sub-portion are mirrored to each other, so that the second edge of the first green sub-portion is adjacent to the second edge of the second sub-portion, the third edge, the fourth edge and the fifth edge of the first green sub-portion are located on a side of the second edge of the first green sub-portion away from the second green sub-portion, and the third edge, the fourth edge and the fifth edge of the second green sub-portion are located on a side of the second edge of the second green sub-portion away from the first green sub-portion; and the third blue sub-unit covers the first edge, the second edge, the third edge and the fifth edge of the first green sub-portion, and the fourth blue sub-unit covers the first edge, the second edge, the third edge and the fourth edge of the second green sub-portion.

For example, the plurality of overlay units further includes at least one red overlay unit corresponding to the at least one green basic unit respectively, the red overlay unit includes a first red overlay unit and a second red overlay unit, the first red overlay unit covers the fourth edge of the first green sub-portion of the green basic unit, and the second red overlay unit covers the fifth edge of the second green sub-portion of the green basic unit.

For example, the third blue sub-unit extends along the first edge, the second edge, the third edge and the fifth edge of the first green sub-portion in a strip shape, and at least a part of the third blue sub-unit covers the first edge, the second edge, the third edge and the fifth edge of the first green sub-portion; and the fourth blue sub-unit extends along the first edge, the second edge, the third edge and the fourth edge of the second green sub-portion in a strip shape, and at least a part of the fourth blue sub-unit covers the first edge, the second edge, the third edge and the fourth edge of the second green sub-portion.

For example, the third blue sub-unit has a width in a range of 3 μm to 10 μm in a direction perpendicular to an extending direction of the third blue sub-unit, and a part of the third blue sub-unit covering the first green sub-portion has a width in a range of 1 μm to 8 μm in a direction perpendicular to the extending direction of the third blue sub-unit;

the fourth blue sub-unit has a width in a range of 3 μm to 10 μm in a direction perpendicular to an extending direction of the fourth blue sub-unit, and a part of the fourth blue sub-unit covering the second green sub-portion has a width in a range of 1 μm to 8 μm in a direction perpendicular to the extending direction of the fourth blue sub-unit.

For example, the blue basic unit is not covered by any overlay unit.

For example, a part of the overlay unit covers an edge of the basic unit, and another part of the overlay unit is in contact with a surface of the light shielding layer on a side of the light shielding layer away from the substrate.

For example, the plurality of sub-pixels are divided into a plurality of pixel units arranged in an array, and each of the plurality of pixel units includes a red sub-pixel, a green sub-pixel and a blue sub-pixel, and wherein the red sub-unit is located on a side of the red sub-pixel away from the substrate, the green sub-unit is located on a side of the green sub-pixel away from the substrate, and the blue sub-unit is located on a side of the blue sub-pixel away from the substrate.

For example, the green sub-pixel includes a first green sub-pixel and a second green sub-pixel, and the green basic unit includes a first green sub-portion and a second green sub-portion, and wherein the first green sub-portion is located on a side of the first green sub-pixel away from the substrate, and the second green sub-portion is located on a side of the second green sub-pixel away from the substrate.

For example, the plurality of pixel units includes at least one first pixel unit and at least one second pixel unit, wherein, in the first pixel unit, the red sub-pixel, the green sub-pixel and the blue sub-pixel are arranged in a first direction, the green sub-pixel and the red sub-pixel are respectively located on two sides of the blue sub-pixel in the first direction, and the first green sub-pixel and the second green sub-pixel of the green sub-pixel are arranged in a second direction, wherein the first direction is a row direction of the array, and the second direction is a column direction of the array;

in the second pixel unit, the red sub-pixel, the green sub-pixel and the blue sub-pixel are arranged in the first direction, the blue sub-pixel and the green sub-pixel are respectively located on two sides of the red sub-pixel in the first direction, and the first green sub-pixel and the second green sub-pixel of the green sub-pixel are arranged in the second direction; and the pixel units located in the same row are first pixel units or second pixel units, and any two adjacent pixel units of the pixel units located in the same column are first pixel unit and second pixel unit respectively.

For example, the display panel further includes: a cover plate on a side of the second layer away from the substrate.

For example, the display panel further includes: a touch layer between the encapsulation layer and the light shielding layer.

For example, at least one of the plurality of sub-pixels includes:

a pixel driving circuit on a side of the substrate facing the light shielding layer;

a planarization layer on a side of the pixel driving circuit away from the substrate;

an anode on a side of the planarization layer away from the substrate, wherein the anode is connected to the pixel driving circuit through a via hole in the planarization layer;

a pixel defining layer on a side of the planarization layer away from the substrate, wherein the pixel defining layer covers an edge of the anode;

a light-emitting layer on a side of the anode away from the substrate;

a cathode on a side of the light-emitting layer away from the substrate, wherein the encapsulation layer is located on a side of the cathode away from the substrate.

According to another aspect of the present disclosure, a mask for manufacturing the display panel is provided, the mask includes a plurality of mask units arranged in an array, each mask unit includes a plurality of light-transmitting areas and non-light-transmitting areas between the light-transmitting areas, wherein the plurality of light-transmitting areas of each mask unit include:

a basic light-transmitting area configured to form a basic unit having a preset color in a first color film layer;

an overlay light-transmitting area configured to form an overlay unit having a preset color in a second color film layer.

For example, the basic light-transmitting area is configured to form a blue basic unit in the first color film layer; and the overlay light-transmitting area includes a first overlay light-transmitting area and a second overlay light-transmitting area, which are respectively used to form a first blue overlay unit and a second blue overlay unit in the second color film layer.

For example, the basic light-transmitting area has a shape of hexagon;

the first overlay light-transmitting area includes a first strip portion and a second strip portion that are parallel to each other; and the second overlay light-transmitting area includes a third strip portion and a fourth strip portion, each of the third strip portion and the fourth strip portion has a first sub-portion, a second sub-portion, a third sub-portion and a fourth sub-portion connected in sequence, wherein the first sub-portion and the third sub-portion are parallel to each other, the second sub-portion is perpendicular to the first sub-portion and the third sub-portion, the fourth sub-portion is inclined at a preset angle with respect to the third sub-portion, and the fourth sub-portion and the first sub-portion are separated from each other; and wherein a projection of the third strip portion on the substrate has a first pattern in a form of an open loop, a projection of the fourth strip portion on the substrate has a second pattern in a form of an open loop, the second pattern is a reverse pattern of the first pattern in a first direction and a second direction, the first direction is a row direction of the array, and the second direction is a column direction of the array.

For example, in at least one mask unit, the first overlay light-transmitting area and the second overlay light-transmitting area are respectively located on two sides of the basic light-transmitting area in the first direction, and the first direction is the row direction of the array;

in at least another mask unit adjacent to the at least one mask unit in the second direction, the basic light-transmitting area and the second overlay light-transmitting area are located on two sides of the first overlay light-transmitting area in the first direction respectively, and the second direction is the column direction of the array.

For example, the basic light-transmitting area is configured to form a green basic unit in the first color film layer;

the overlay light-transmitting area is configured to form a green overlay unit in the second color film layer.

For example, the basic light-transmitting area is configured to form a red basic unit in the first color film layer;

the overlay light-transmitting area is configured to form a red overlay unit in the second color film layer.

For example, in at least one mask unit, the overlay light-transmitting area is located on a side of the basic light-transmitting area in the first direction, and the overlay light-transmitting area and the basic light-transmitting area are separated by a first distance in the first direction.

In at least another mask unit adjacent to the at least one mask unit in the second direction, the overlay light-transmitting area is located on a side of the basic light-transmitting area in the first direction, the overlay light-transmitting area and the basic light-transmitting area are separated by a second distance in the first direction, and the second distance is greater than the first distance.

DETAILED DESCRIPTION OF EMBODIMENTS

Figure 1:
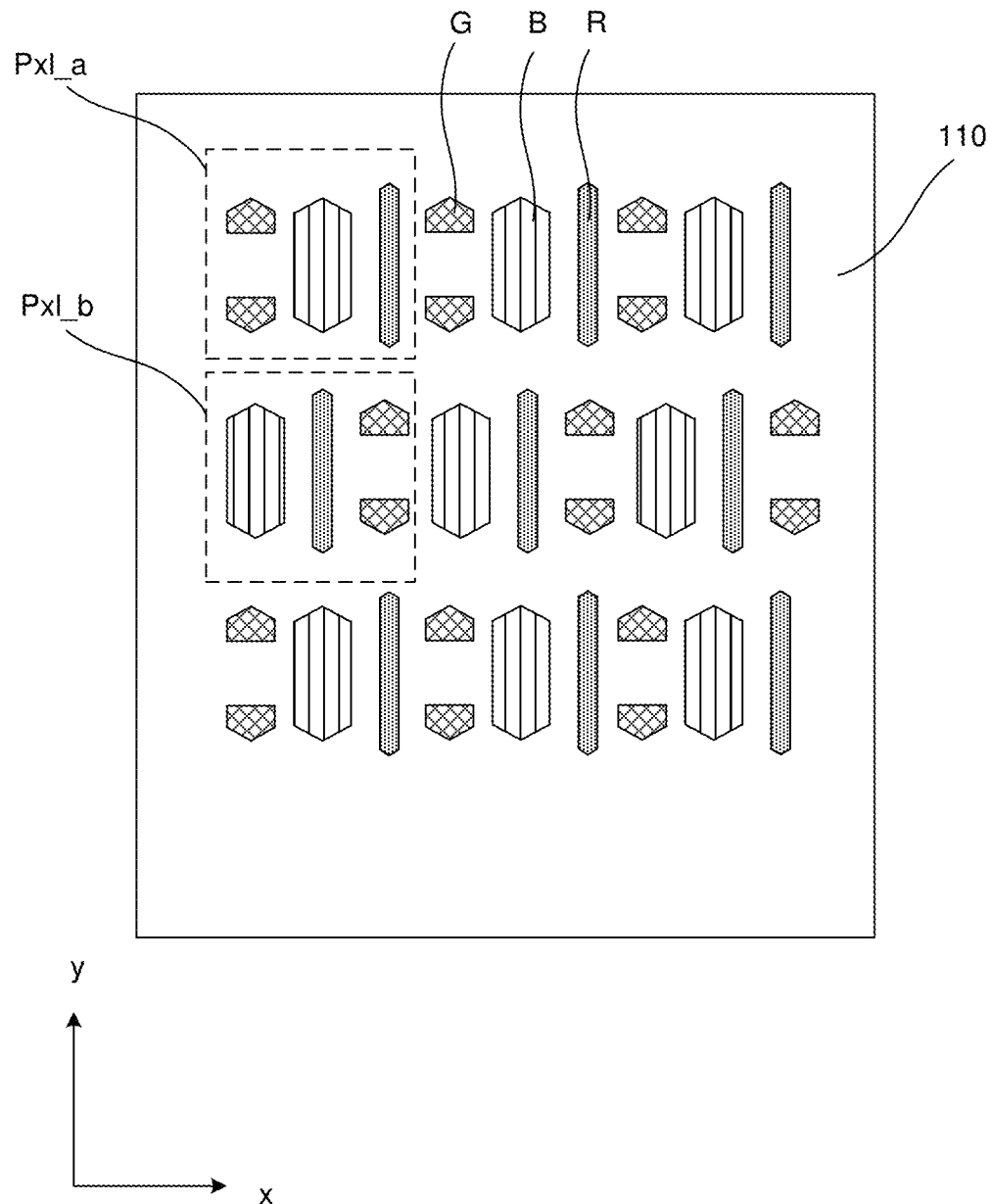
FIG. 1 shows a pixel layout diagram of a display panel according to the embodiments of the present disclosure.

In order to make objectives, technical solutions and advantages of the embodiments of the present disclosure more apparent, technical solutions in the embodiments of the present disclosure will be described clearly and completely in conjunction with the accompanying drawings in the embodiments of the present disclosure. Obviously, the embodiments described are a part of the embodiments of the present disclosure, not all of the embodiments of the present disclosure. Based on the described embodiments of the present disclosure, all other embodiments obtained by those skilled in the art without creative work are all within the protection scope of the present disclosure. It should be noted that throughout the drawings, the same elements are indicated by the same or like reference numerals. In the following description, some specific embodiments are examples of the embodiments of the present disclosure and are only used for descriptive purposes, and should not be understood as limiting the present disclosure. When it may cause confusion in understandings of the present disclosure, conventional structures or configurations will be omitted. It should be noted that the shape and the size of each component in the drawings do not reflect actual sizes and ratios, which merely illustrate the content of the embodiments of the present disclosure.

Unless otherwise defined, technical or scientific terms used in the embodiments of the present disclosure should have general meanings understood by those skilled in the art. "First", "second" and similar words used in the embodiments of the present disclosure do not indicate any order, quantity, or importance, and are only used to distinguish different components.

In addition, in the description of the embodiments of the present disclosure, the term "coupled to" or "connected to" may indicate that two components are directly electrically connected or may indicate that two components are electrically connected via one or more other components. In addition, the two components may be electrically connected or coupled in a wired manner or a wireless manner.

Generally, in a display panel formed based on the COE technology, ambient light becomes monochromatic light after entering the display panel through a color film of the display panel. At an edge of an opening of a black matrix, the monochromatic light will produce a diffraction/dispersion effect, thereby generating an incident diffraction light which is divergent in various directions. The incident diffraction light is then reflected by a bottom metal film layer (e.g., anode, cathode, etc. of the OLED) of the display panel, resulting in a monochromatic reflection light which is divergent. The monochromatic light overlaps with monochromatic light from adjacent sub-pixels or from alternate sub-pixels of the same color, such that the intensity of a reflection light at the overlap is increased, resulting in a periodic monochromatic or mixed-color bright fringe, that is, the color separation.

The embodiments of the present disclosure provide a display panel and a mask. By overlaying a second color film layer on an edge of each basic unit in a first color film layer of a display panel, the diffraction effect of incident ambient light may be weakened, thereby alleviating the color separation phenomenon.

FIG. 1 shows a pixel layout diagram of a display panel according to the embodiments of the present disclosure.

As shown in FIG. 1, the display panel includes a substrate 110 and a plurality of pixel units arranged in an array on the substrate 110. In FIG. 1, x represents a row direction (first direction) of the array, and y represents a column direction (second direction) of the array. In FIG. 1, a pixel unit Px1_a (first pixel unit) and a pixel unit Px1_b (second pixel unit) having two different layouts respectively are illustrated.

Each of the pixel unit Px1_a and the pixel unit Px1_b may include a red sub-pixel R, a green sub-pixel G and a blue sub-pixel B. In FIG. 1, the pixel unit is set to a GGRB structure, that is, each pixel unit includes a first green sub-pixel and a second green sub-pixel (collectively denoted by G) that are arranged symmetrically to each other, a blue sub-pixel B and a red sub-pixel R.

In the pixel unit Px1_a, the red sub-pixel R, the green sub-pixel G and the blue sub-pixel B are arranged in the x direction, and the green sub-pixel G and the red sub-pixel R are respectively located on two sides of the blue sub-pixel B in the x direction, where the first green sub-pixel and the second green sub-pixel of the green sub-pixel G are arranged in the y direction.

In the pixel unit Px1_b, the red sub-pixel R, the green sub-pixel G and the blue sub-pixel B are arranged in the x direction, and the blue sub-pixel B and the green sub-pixel G are respectively located on two sides of the red sub-pixel in the x direction, where the first green sub-pixel and the second green sub-pixel of the green sub-pixel G are arranged in the y direction.

In FIG. 1, all the pixel units located in the same row are pixel units Px1_a or pixel units Px1_b, and one of any two adjacent pixel units located in the same column is the pixel unit Px1_a and the other one of the two adjacent pixel units is the pixel unit Px1_b. For example, the pixel units Px1_a are located in odd-numbered rows, the pixel units Px1_b are located in even-numbered rows, and vice versa, so that one of any two adjacent pixel units in the y direction is pixel unit Px1_a, and the other one is pixel unit Px1_b. In this way, no matter in the row direction or the column direction, any two adjacent sub-pixels have different colors. However, the embodiments of the present disclosure are not limited thereto. In some embodiments, pixel units in one layout, such as pixel units Px1_a, may be used. In other embodiments, pixel units in three or more layouts may be used, which are not limited here.

In FIG. 1, for ease of description, the shape and position of each sub-pixel are represented by a projection of an opening area of each sub-pixel on the substrate. However, those skilled in the art should understand that this does not limit the actual structure of each sub-pixel.

Figure 2:
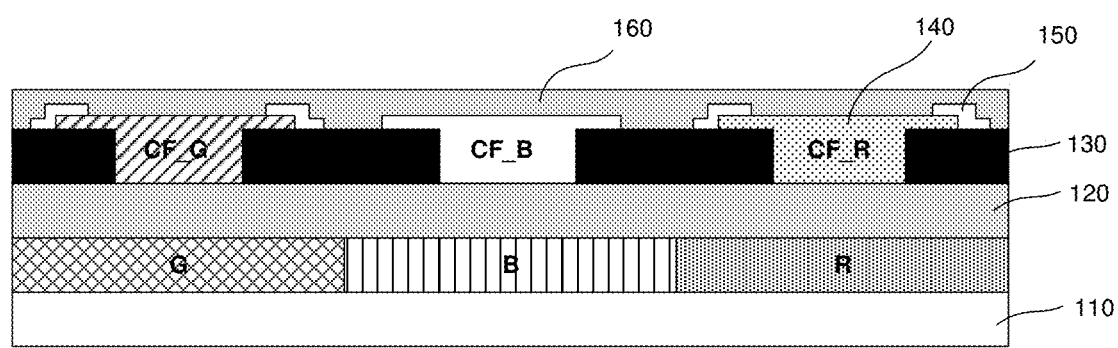
FIG. 2 shows a cross-sectional view of a display panel according to the embodiments of the present disclosure.

FIG. 2 shows a cross-sectional view of a display panel according to the embodiments of the present disclosure.

As shown in FIG. 2, the display panel includes a substrate 110 and a plurality of sub-pixels, such as a red sub-pixel R, a green sub-pixel G, and a blue sub-pixel B, disposed on a side of the substrate 110. The display panel 110 further includes an encapsulation layer 120, a light shielding layer 130, a first color film layer 140 and a second color film layer 150.

The encapsulation layer 120 is located on a side of the plurality of sub-pixels R, G and B away from the substrate 110 and covers the plurality of sub-pixels R, G and B.

The light shielding layer 130 is located on a side of the encapsulation layer 120 away from the substrate 110. The light shielding layer 130 may be provided with a plurality of openings corresponding to the plurality of sub-pixels R, G and B, respectively. For example, the light shielding layer 130 may be a black matrix.

The first color film layer 140 includes a plurality of basic units, such as a red basic unit CF_R, a green basic unit CF_G, and a blue basic unit CF_B. The plurality of basic units CF_R, CF_G and CF_B respectively cover the plurality of openings in the light shielding layer 120, so that the red basic unit CF_R is located above the red sub-pixel R (i.e. the side away from the substrate 110), the green basic unit CF_G is located above the green sub-pixel G, and the blue basic unit CF_B is positioned above the blue sub-pixel B.

The second color film layer 150 is located on a side of the first color film layer 140 away from the substrate 110. The second color film layer 150 includes a plurality of overlay units that respectively cover an edge of at least one basic unit of the plurality of basic units, where the basic unit and the overlay unit covering the basic unit have different colors. For example, in FIG. 2, an edge of the red basic unit CF_R and an edge of the green basic unit CF_G are both covered by blue overlay units in the second color film layer 150. In FIG. 2, a part of each overlay unit in the second color film layer 150 covers the basic unit below the overlay unit, and another part of the overlay unit is in contact with a surface of the light shielding layer 130 on a side of the light shielding layer 130 away from the substrate 110. The blue basic unit CF_B is not covered by any overlay units, so that an entire surface of the blue basic unit CF_B on a side away from the substrate 110 is in contact with the encapsulation layer 160, and a thickness of a color film above the red sub-pixel R and the green sub-pixel G is greater than a thickness of a color film above the blue sub-pixel B. The thickness of the color film may refer to a distance between two side surfaces of the color film in a direction perpendicular to a surface of the substrate 110. For example, the thickness of the color film above the green sub-pixel G may refer to a distance between a surface of the green basic unit CF_G on a side close to the substrate 110 and a surface of the overlay unit 150 covering the green basic unit CF_G on a side away from the substrate 110, the thickness of the color film above the red sub-pixel R may refer to a distance between a surface of the red basic unit CF_R on a side close to the substrate 110 and a surface of the overlay unit 150 covering the red basic unit CF_R on a side away from the substrate 110, and the thickness of the color film above the blue sub-pixel B may refer to a distance between a surface of the blue basic unit CF_B on a side close to the substrate 110 and a surface of the blue basic unit CF_B on a side away from the substrate 110. The embodiments of the present disclosure are not limited thereto, and an edge of any basic unit may be covered by one or more overlay units of any suitable color as required, which will be described in further detail below.

Figure 3:
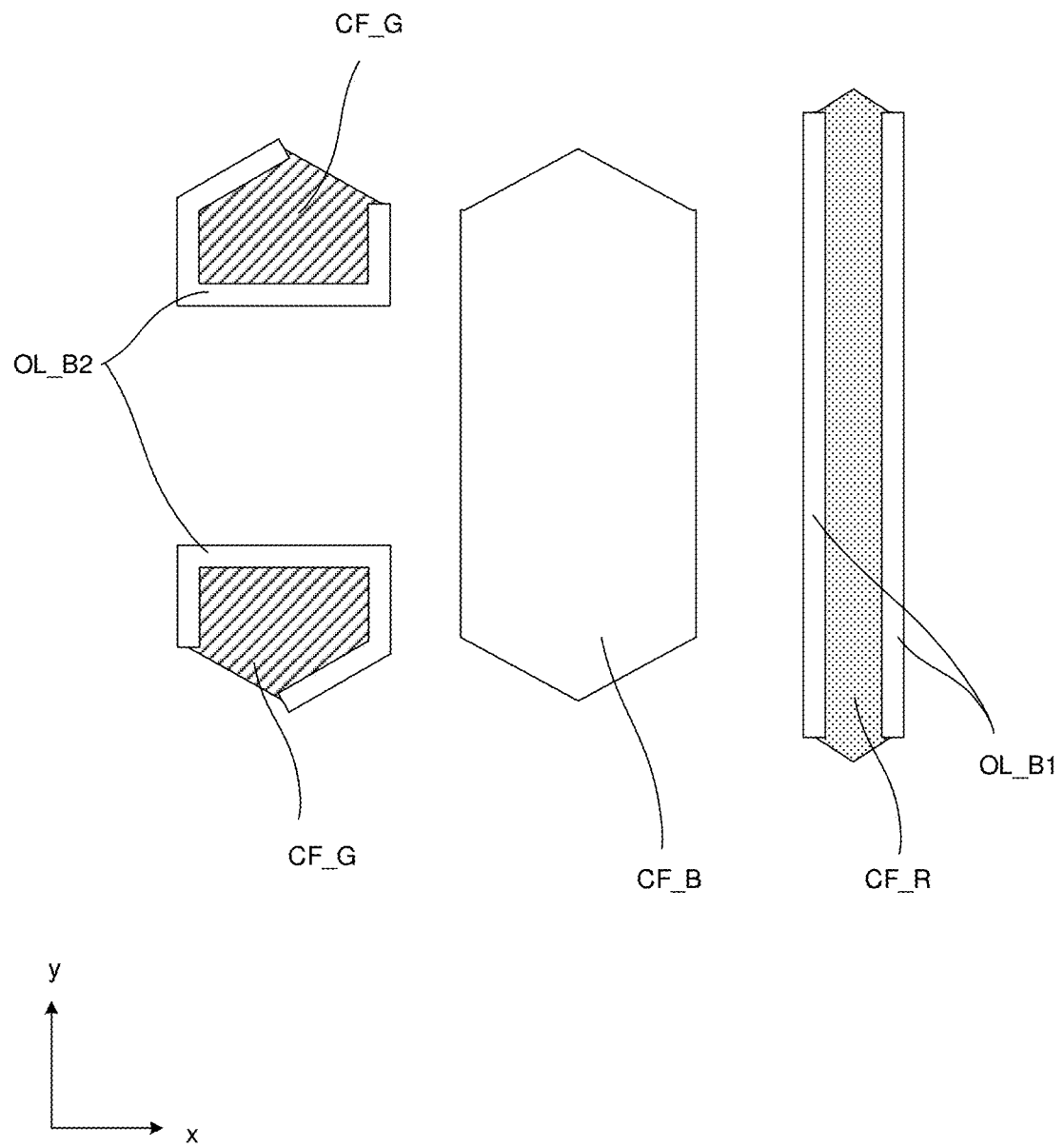
FIG. 3 shows a structure diagram of a color film for a pixel unit in a display panel according to the embodiments of the present disclosure.

FIG. 3 shows a color film structure diagram for a pixel unit in a display panel according to the embodiments of the present disclosure.

As shown in FIG. 3, a plurality of basic units for pixel units in a first color film layer include a red basic unit CF_R for a red sub-pixel R, a green basic unit CF_G for a green sub-pixel G, and a blue basic unit CF_B for a blue sub-pixel B. A plurality of overlay units for pixel units in a second color film layer include a first blue overlay unit OL_B1 and a second blue overlay unit OL_B2. At least a part of an edge of the red basic unit CF_R is covered by the first blue overlay unit OL_B1 corresponding to the red basic unit, and at least a part of an edge of the green basic unit CF_G is covered by the second blue overlay unit OL_B2 corresponding to the green basic unit.

In the embodiments of the present disclosure, by covering the edge of the basic unit with the overlay unit having a different color than the basic unit, the ambient light, which enters the display panel from the edge of the basic unit and passes through the second color film layer, substantially does not pass through the first color film layer below the second color film layer, thereby reducing the incident diffracted light at the edge of the opening of the light shielding layer. On the one hand, the range and intensity of reflected light may be weakened, thereby reducing the overlapping area of reflected light, reducing the phenomenon of color separation and reflectivity. On the other hand, it is possible to adjust the viewing angle range of the display panel as desired by designing the size and optical characteristics of the edge-overlay color film, so as to implement the anti-peeping function. In addition, it is also possible to adjust the apparent hue and reflectivity of the display panel by designing the edge-overlay color film.

In the embodiments of the present disclosure, considering that the human eye is less sensitive to blue light than red light and green light, the blue overlay unit is used to cover the edges of the red and green basic units. In this way, the appearance of the display panel is bluish, which may improve the viewing comfort for human eyes while reducing the reflectivity.

Figure 4:
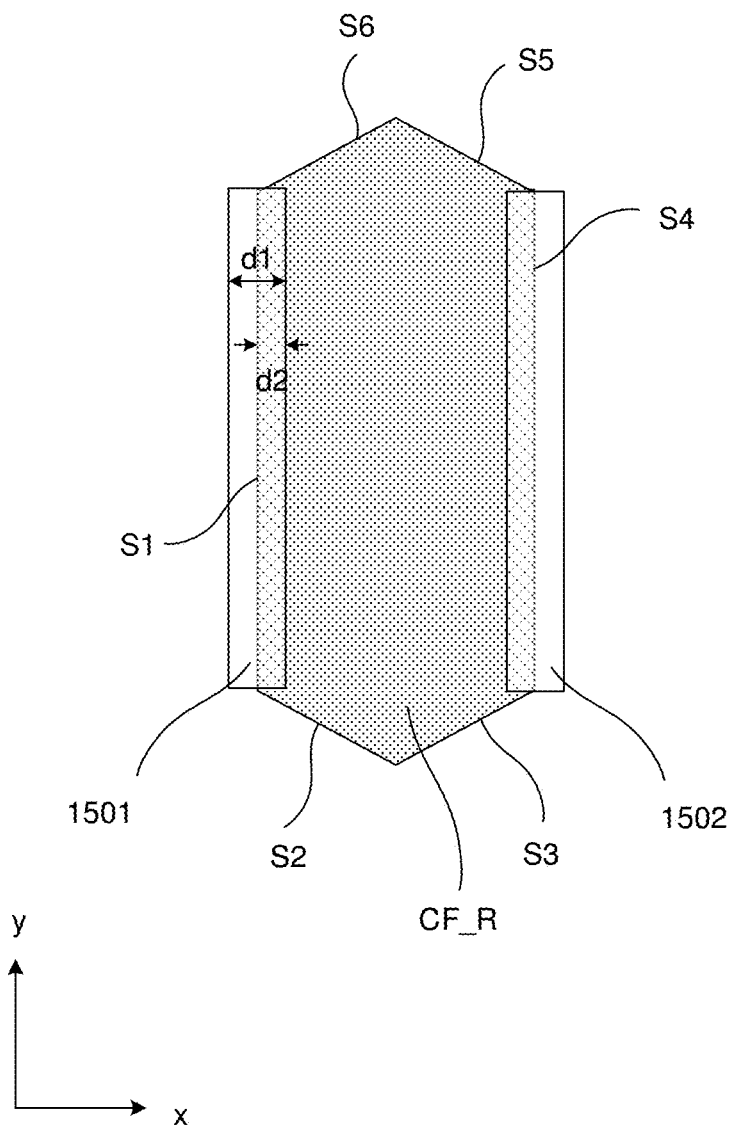
FIG. 4 shows a structure diagram of a color film for a red sub-pixel in a display panel according to the embodiments of the present disclosure.

FIG. 4 shows a structure diagram of a color film for a red sub-pixel in a display panel according to the embodiments of the present disclosure.

As shown in FIG. 4, a projection of a red basic unit CF_R in a first color film layer on a substrate has a shape of hexagon. The red basic unit CF_R has a first edge S1, a second edge S2, a third edge S3, a fourth edge S4, a fifth edge S5 and a sixth edge S6 connected in sequence. The first edge S1 and the fourth edge S4 are parallel to each other and have a first length, and the second edge S2, the third edge S3, the fifth edge S5 and the sixth edge S6 have a second length that is smaller than the first length. In FIG. 4, the first edge S1 and the fourth edge S4 extend in the y direction, and an angle between the second edge S2 and the first edge S1, an angle between the third edge S3 and the fourth edge S4, an angle between the sixth edge S6 and the first edge S1 and an angle between the fifth edge S5 and the fourth edge S4 are equal and are all greater than 90 degrees.

A first blue overlay unit includes a first blue sub-unit 1501 and a second blue sub-unit 1502. The first blue sub-unit 1501 covers the first edge S1 of the red basic unit CF_R, and the second blue sub-unit 1502 covers the fourth edge S4 of the red basic unit CF_R. As shown in FIG. 4, the first blue sub-unit 1501 may extend along the first edge S1 of the red basic unit CF_R in a strip shape, and at least a part of the first blue sub-unit 1501 covers the first edge S1 of the red basic unit CF_R. Similarly, the second blue sub-unit 1502 may extend along the fourth edge S4 of the red basic unit CF_R in a strip shape, and at least a part of the second blue sub-unit 1502 covers the fourth edge S4 of the red basic unit CF_R.

The first blue sub-unit 1501 has a width d1 in a range of 3 μm to 10 μm in a direction perpendicular to an extending direction of the first blue sub-unit, and a part of the first blue sub-unit 1501 covering the red basic unit CF_R has a width in a range of 1 μm to 8 μm in a direction perpendicular to the extending direction of the first blue sub-unit.

Similarly, the second blue sub-unit 1502 has a width in a range of 3 μm to 10 μm in a direction perpendicular to an extending direction of the second blue sub-unit, and a part of the second blue sub-unit 1502 covering the red basic unit CF_R has a width in a range of 1 μm to 8 μm in a direction perpendicular to the extending direction of the second blue sub-unit. In some embodiments, the width of the first blue sub-unit 1501 and the second blue sub-unit 1502 in the extension direction are the same, and the width of the part covering the basic unit is also the same.

Figure 5:
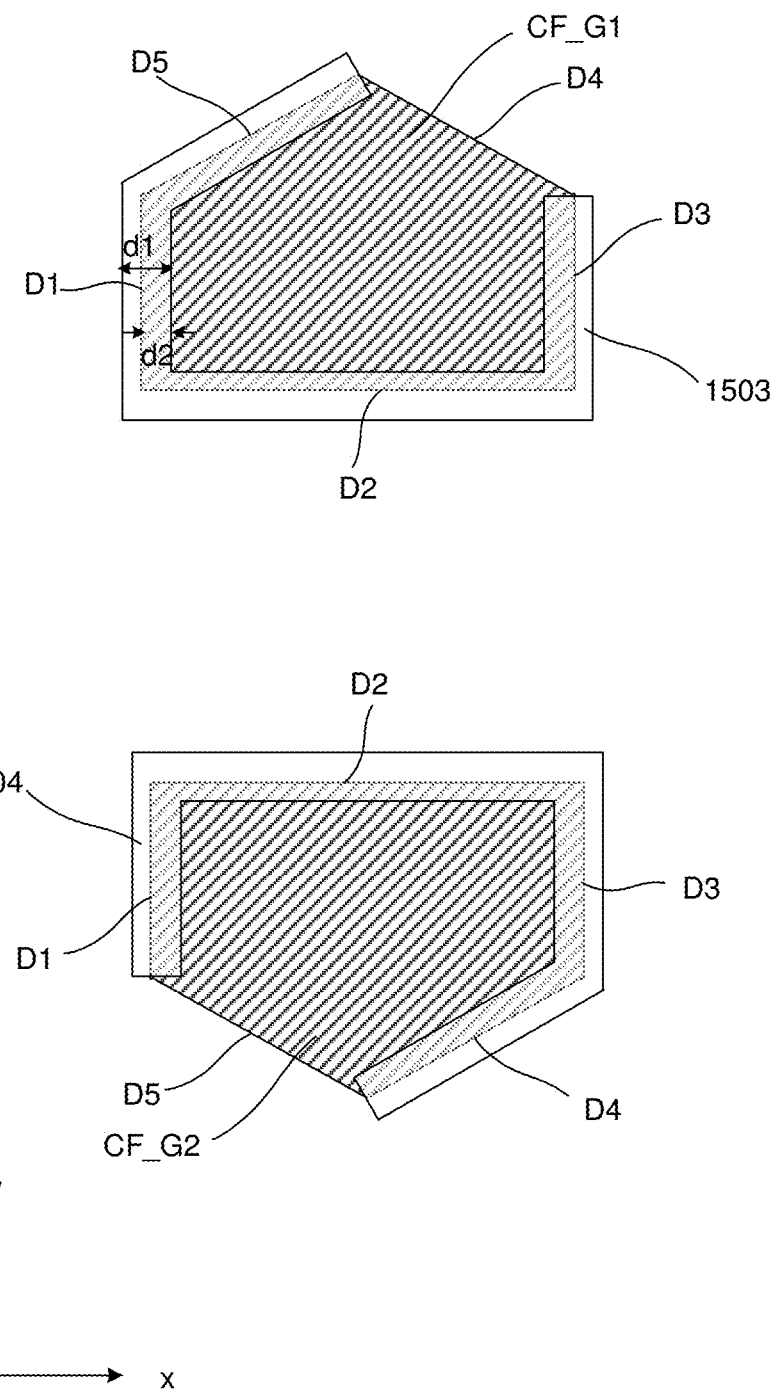
FIG. 5 shows a structure diagram of a color film for a green sub-pixel in a display panel according to the embodiments of the present disclosure.

FIG. 5 shows a structure diagram of a color film for a green sub-pixel in a display panel according to the embodiments of the present disclosure.

As shown in FIG. 5, a green basic unit CF_G for a green sub-pixel in a first color film layer includes a first green sub-portion CF_G1 and a second green sub-portion CF_G2. The first green sub-portion CF_G1 is located on a side of the first green sub-pixel away from the substrate, and the second green sub-portion CF_G2 is located on a side of the second green sub-pixel away from the substrate.

As shown in FIG. 5, each of projections of the first green sub-portion CF_G1 and the second green sub-portion CF_G2 on the substrate has a shape of pentagon. Each of the first green sub-portion CF_G1 and the second green sub-portion has a first edge D1, a second edge D2, a third edge D3, a fourth edge D4 and a fifth edge D5 connected in sequence. In FIG. 5, the first edge D1 is in parallel with the third edge D3, the second edge D2 is perpendicular to the first edge D1 and the third edge D3, and an angle between the fourth edge D4 and the third edge D3 is equal to an angle between the fifth edge D5 and the first edge D1.

In FIG. 5, the first green sub-portion CF_G1 and the second green sub-portion CF_G2 are mirrored to each other with respect to the x-direction, so that the second edge D2 of the first green sub-portion CF_G1 and the second edge D2 of the second sub-portion CF_G2 are adjacent, and the third edge D3, the fourth edge D4 and the fifth edge D5 of the first green sub-portion CF_G1 are located on a side of the second edge D2 of the first green sub-portion CF_G1 away from the second green sub-portion CF_G2; and the third edge D3, the fourth edge D4 and the fifth edge D5 of the second green sub-portion CF_G2 are located on a side of the second green sub-portion CF_G2 away from the first green sub-portion CF_G1.

Accordingly, a second blue overlay unit OL_B2 may include a third blue sub-unit 1503 and a fourth blue sub-unit 1504. The third blue sub-unit 1503 may cover at least one of the first edge D1, the second edge D2, the third edge D3, the fourth edge D4 and the fifth edge D5 of the first green sub-portion CF_G1, and the fourth blue sub-unit 1504 may cover at least one of the first edge, the second edge, the third edge, the fourth edge and the fifth edge of the second green sub-portion CF_G2.

For example, in FIG. 5, the third blue sub-unit 1503 covers the first edge D1, the second edge D2, the third edge D3 and the fifth edge D5 of the first green sub-portion CF_G1, The fourth blue sub-unit 1504 covers the first edge D1, the second edge D2, the third edge D3 and the fourth edge D4 of the second green sub-portion CF_G2. As shown in FIG. 5, the third blue sub-unit 1503 may extend in a strip shape along the first edge D1, the second edge D2, the third edge D3 and the fifth edge D5 of the first green sub-portion CF_G1, and at least a part of the third blue sub-unit 1503 covers the first edge D1, the second edge D2, the third edge D3 and the fifth edge D5 of the first green sub-portion CF_G1. Similarly, the fourth blue sub-unit 1504 may extend in a strip shape along the first edge D1, the second edge D2, the third edge D3 and the fourth edge D4 of the second green sub-portion CF_G2, and at least a part of the fourth blue sub-unit 1504 covers the first edge D1, the second edge D2, the third edge D3 and the fourth edge D4 of the second green sub-portion CF_G2.

The third blue sub-unit 1503 has a width dl in a range of 3 μm to 10 μm in a direction perpendicular to an extending direction of the third blue sub-unit, and a part of the third blue sub-unit 1503 covering the first green sub-portion CF_G1 has a width in a range of 1 μm to 8 μm in a direction perpendicular to the extending direction of the third blue sub-unit. Similarly, the fourth blue sub-unit 1504 has a width in a range of 3 μm to 10 μm in a direction perpendicular to an extending direction of the fourth blue sub-unit, and a part of the fourth blue sub-unit 1504 covering the second green sub-portion CF_G2 has a width in a range of 1 μm to 8 μm in a direction perpendicular to the extending direction of the fourth blue sub-unit. In some embodiments, the first to fourth blue sub-units 1501, 1502, 1503 and 1504 may have the same width in the extending direction and the parts of the first to fourth blue sub-units 1501, 1502, 1503 and 1504 covering respective basic units below also have the same width.

Figure 6:
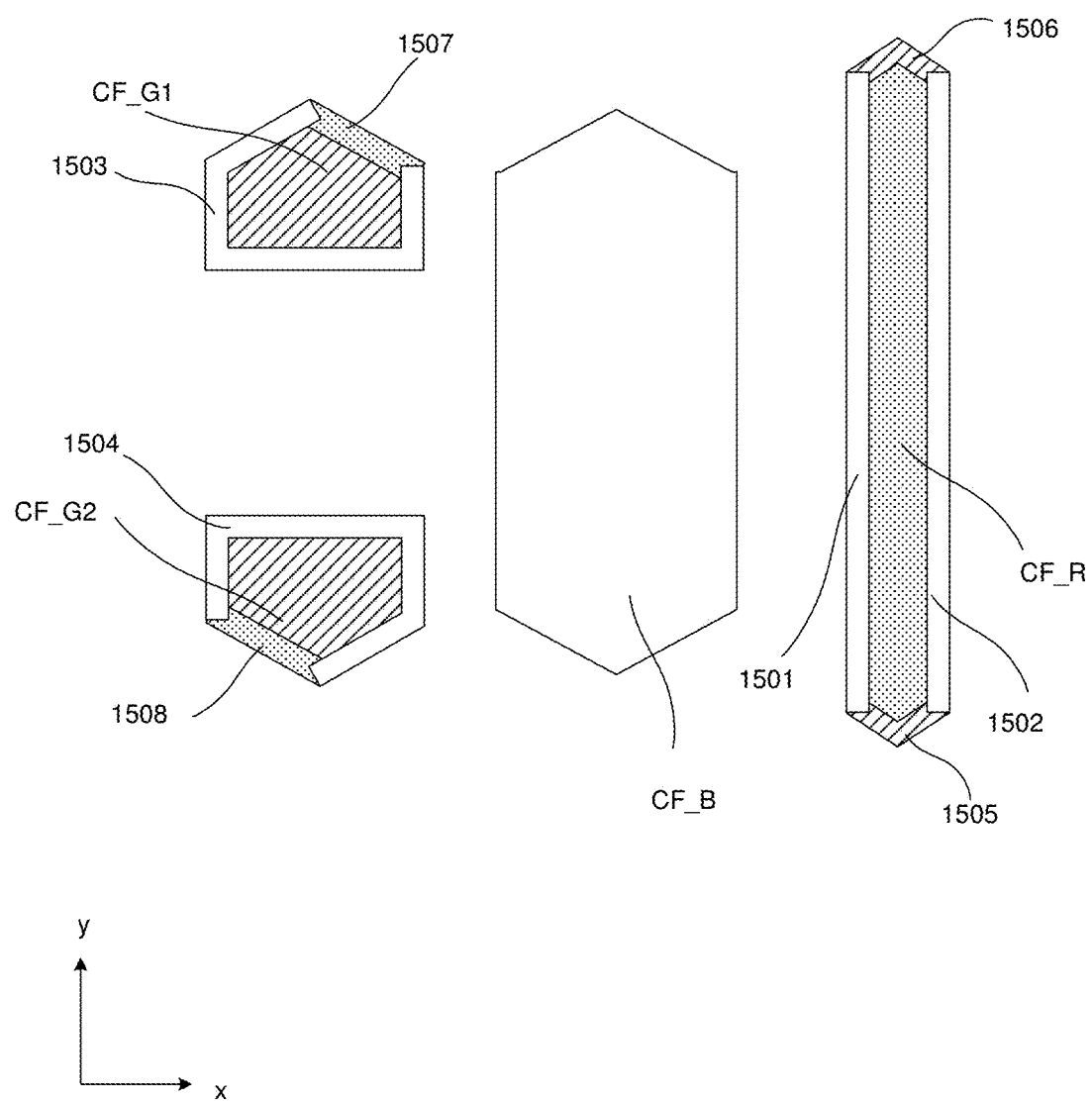
FIG. 6 shows a structure diagram of a color film for a pixel unit in a display panel according to another embodiment of the present disclosure.

FIG. 6 shows a structure diagram of a color film for a pixel unit in a display panel according to another embodiment of the present disclosure. The structure of the color film in FIG. 6 is similar to that of FIG. 3, and the difference is at least in a green overlay unit and a red overlay unit are added. For ease of brevity, the following will mainly describe the different parts in detail.

As shown in FIG. 6, compared with FIG. 3, in addition to the above-mentioned first to fourth blue sub-units 1501 to 1504, the plurality of overlay units for the pixel units in the second color film layer also include the green overlay unit and the red overlay unit.

The green overlay unit includes a first green overlay unit 1505 and a second green overlay unit 1506. The first green overlay unit 1505 may extend along a second edge and a third edge of a red basic unit CF_R in a strip shape and cover the second edge and the third edge of the red basic unit CF_R. The second green overlay unit 1506 may extend along a fifth edge and a sixth edge of the red basic unit CF_R in a strip shape and cover the fifth edge and the sixth edge of the red basic unit CF_R. In some embodiments, two ends of the first green overlay unit 1505 are respectively covered by one end of the first blue sub-unit 1501 and one end of the second blue sub-unit 1502, and two ends of the second green overlay unit 1506 are respectively covered by the other end of the first blue sub-unit 1501 and the other end of the second blue sub-unit 1502.

The red overlay unit includes a first red overlay unit 1507 and a second red overlay unit 1508. The first red overlay unit 1507 may extend in a strip shape along a fourth edge of a first green sub-portion CF_G1 of a green basic unit and cover the fourth edge of the first green sub-portion CF_G1 of the green basic unit. The second red overlay unit 1508 may extend in a strip shape along a fifth edge of a second green sub-portion CF_G2 of the green basic unit and cover the fifth edge of the second green sub-portion CF_G2 of the green basic unit. In some embodiments, two ends of the first red overlay unit 1507 are respectively covered by two ends of the third blue sub-unit 1503, and two ends of the second red overlay unit 1508 are respectively covered by two ends of the fourth blue sub-unit 1504.

Stripe widths of the first green overlay unit 1505, the second green overlay unit 1506, the first red overlay unit 1507, and the second red overlay unit 1508 and the widths of the parts thereof covering the basic units below may be set as those described above for the first to the fourth blue sub-units 1501 to 1504. In some embodiments, all overlay units may have the same strip width and parts of the overlay units covering the basic units below the overlay units may also have the same strip width.

In the above-mentioned embodiments, the width (also called overall width) of each overlay unit perpendicular to the extending direction and the width (also called covering width) of the part covering the basic unit below the overlay unit may be designed according to the size of the sub-pixel within the above-mentioned given range. For example, the overall width of the overlay unit may be designed to be 20% to 40%, e.g. 30%, of the width of the overlay unit below; the covering width of the overlay unit is designed to be 10% to 30%, e.g 20%, of the width of the basic unit below. The width of the basic unit may refer to the size of the basic unit in the row direction (i.e. the above-mentioned x direction) of the sub-pixel array. In some embodiments, each overlay unit may have a width in a range of 3 μm to 4 μm, for example a width of 3 μm, in a direction perpendicular to the extending direction of the each overlay unit; and the part of the each overlay unit covering the basic unit below has a width in a range of 1 μm to 2 μm in a direction perpendicular to the extending direction of the each overlay unit. In other embodiments, each of the first blue sub-unit 1501 and the second blue sub-unit 1502 may have a width in a range of 7 m to 10 μm in a direction perpendicular to the extending direction of each of the first blue sub-unit and the second blue sub-unit; and the part of the each of the first blue sub-unit and the second blue sub-unit covering the basic unit below may have a width in a range of 5 μm to 8 μm in a direction perpendicular to the extending direction of the each of the first blue sub-unit and the second blue sub-unit.

Figure 7A:
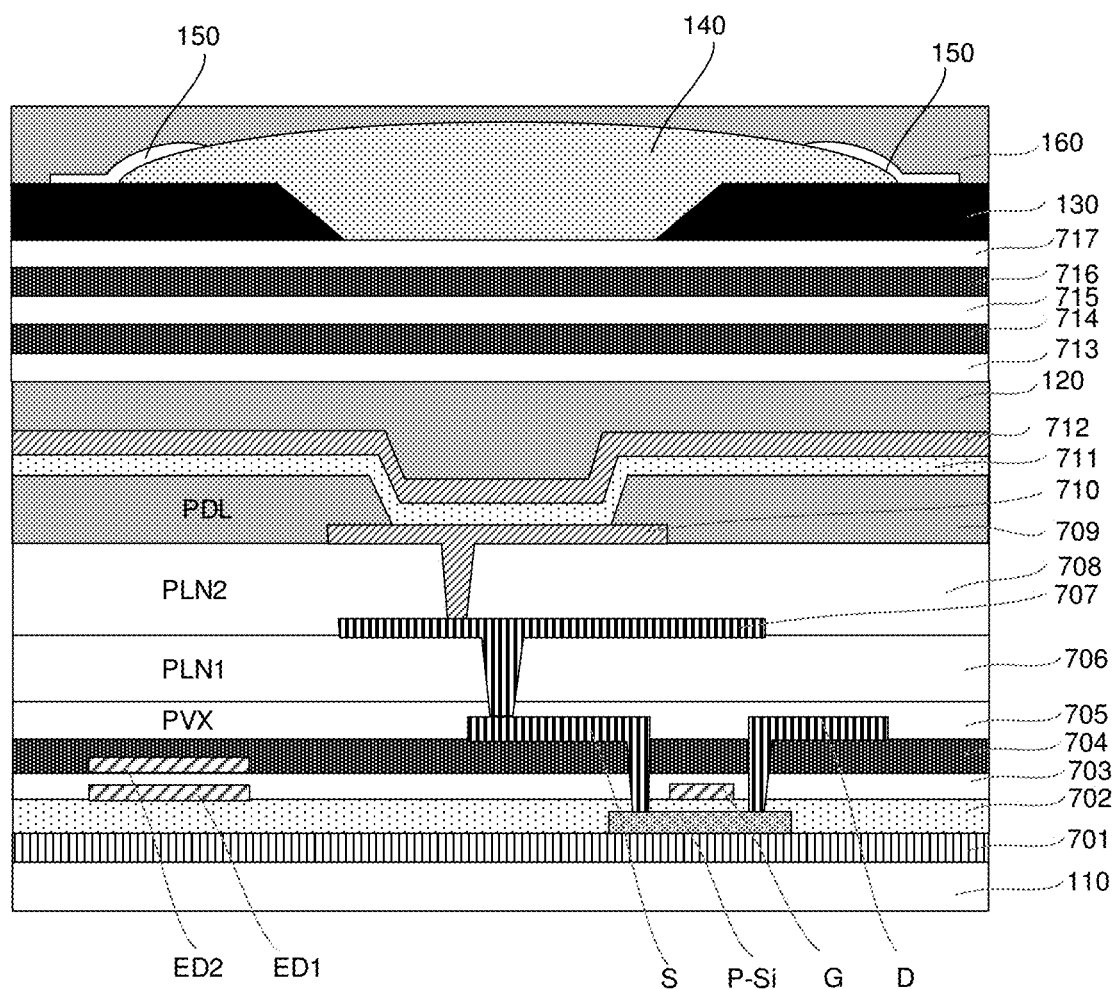
FIG. 7A shows a cross-sectional view of a display panel according to another embodiment of the present disclosure.

FIG. 7A shows a cross-sectional view of a display panel according to another embodiment of the present disclosure.

As shown in FIG. 7A, the display panel includes a substrate 110 and a sub-pixel arranged on the substrate, and the sub-pixel may include a pixel driving circuit. In FIG. 7A, the pixel driving circuit includes a gate driving circuit having a gate electrode G, a source electrode S and a drain electrode D and a capacitor having a first electrode ED1 and a second electrode ED2. An active layer P—Si of a thin film transistor is located between a buffer layer 701 and a first gate insulating layer 702 and is connected to the electrode source S and the drain electrode D. An interlayer insulating layer 704 is located between the gate electrode G and the source and drain electrodes S and D. The first gate insulating layer 702 is located on a side of the interlayer insulating layer 704 facing the base substrate 110. A second gate insulating layer 703 is located between the interlayer insulating layer 704 and the first gate insulating layer 702. The first electrode ED1 of the capacitor is disposed in the same layer as the gate electrode G of the thin film transistor, and the second electrode ED2 of the capacitor is disposed between the interlayer insulating layer 704 and the second gate insulating layer 703.

The sub-pixel may further include a passivation layer 705, a first planarization layer 706, a connection electrode 707 and a second planarization layer 708. The passivation layer 705 is located on a side of the interlayer dielectric layer 704 away from the base substrate 110. The first planarization layer 706 is located on a side of the passivation layer 705 away from the base substrate 110. The connection electrode 707 is located on a side of the first planarization layer 706 away from the base substrate 110 and is connected to the source electrode S of the thin film transistor through a via hole in the first planarization layer 706 and the passivation layer 705. The second planarization layer 708 is disposed on a side of the connection electrode 707 away from the base substrate 110 and at least partially covers the connection electrode 707.

The sub-pixel may also include a pixel defining layer 709 and a light-emitting element including an anode 710, a light-emitting layer 711 and a cathode 712. The pixel defining layer 709 is located on a side of the second planarization layer 708 away from the base substrate 110, and a gap (also called PDL Gap) between pixel defining layers of two adjacent sub-pixels in the row direction may be 19 μm. The anode 710 is located on a side of the second planarization layer 708 away from the base substrate 110 and is connected to the connection electrode 707 through a via hole in the second planarization layer 708. The light-emitting layer 711 is located on a side of the anode 710 away from the base substrate 110 and partially covers the anode 710. The cathode 712 is located on a side of the light-emitting layer 711 away from the base substrate 110.

An encapsulation layer 120 is located on a side of the cathode 712 away from the base substrate 110. In some embodiments, the encapsulation layer 120 may include a first inorganic encapsulation layer, an organic encapsulation layer, and a second inorganic encapsulation layer overlaid in sequence.

In some embodiments, the display panel may further include a touch layer between the encapsulation layer 120 and the light shielding layer 130. In FIG. 7A, the touch layer includes a first dielectric layer 713, a first electrode layer 714, a second dielectric layer 715, a second electrode layer 716 and a third dielectric layer 717. The first electrode layer 714 is located on a side of the encapsulation layer 120 away from the substrate 110, the second electrode layer 716 is located on a side of the first electrode layer 714 away from the substrate 110, the first dielectric layer 713 is located between the encapsulation layer 120 and the first electrode layer 714, the second dielectric layer 715 is located between the first electrode layer 714 and the second electrode layer 716, and the third dielectric layer 717 is located between the second electrode layer 716 and the light shielding layer 130. A basic unit in a first color film layer 140 covers an opening in the light shielding layer 130. An overlay unit in the second color film layer 150 has a part covering an edge of the basic unit in the first color film layer 140, and another part contacting a surface of the light shielding layer 130 on a side of the light shielding layer 130 away from the substrate 110. The display panel may further include a cover plate 160 located on a side of the second color film layer 150 away from the substrate 110.

Figure 7B:
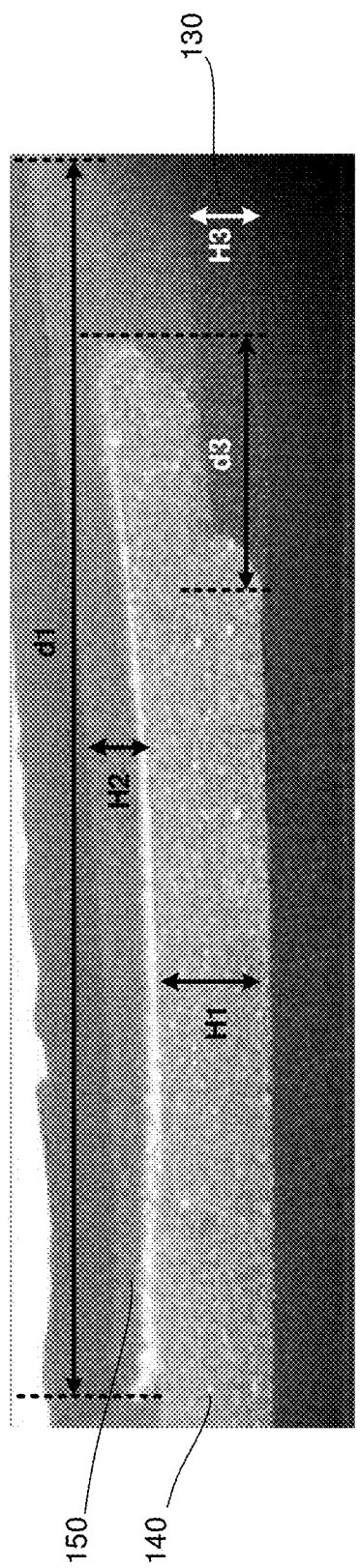
FIG. 7B shows a microscopic cross-sectional view of a structure of a color film layer of a display panel according to the embodiments of the present disclosure.

FIG. 7B shows a microscopic cross-sectional view of a structure of a color film layer of a display panel according to the embodiments of the present disclosure.

As shown in FIG. 7B, a thickness H1 (i.e. the size in the direction perpendicular to the surface of the substrate) of a first color film layer 140 may be in a range of 2 μm to 3 μm, such as 2.465 μm. A thickness H1 of a second color film layer 150 may be in a range of 1 μm to 2 μm, such as 1.5 μm, and may be 1.233 μm in some embodiments. A thickness H3 of a light shielding layer 130 may be in a range of 1 μm to 2 μm, such as 1.506 μm. A stripe width dl of an overlay unit in the second color film layer 150 is in a range of 3.5 μm to 4 μm. A distance between a basic unit in the first color film layer 140 and an opening edge of the light shielding layer 130 is in a range of 1.5 μm to 2.5 μm, such as 2 μm. Each of the first color film layer 140 and the second color film layer 150 may be made of a negative adhesive material. In the production process, the negative-tone adhesive material is firstly coated, and then the negative-tone adhesive material is exposed by using a mask. A part of the negative adhesive material exposed to light is retained to form a color film layer. A part of the negative adhesive material that has not received light is washed away, and at the same time, a bottom edge of the retained part is also washed away, so that the bottom surface of the edge of the finally formed color film layer has a certain slope relative to the surface of the film layer below it, that is, the finally formed color film layer has an undercut structure. The length d3 of the undercut part may be about 2.0 μm, and a slope angle may be in a range of 30 degrees to 50 degrees, depending on the thickness and process of the color film layer. In the embodiments of the present disclosure, the thickness of the first color film layer 140 is greater than the thickness of the second color film layer 150, so the slope angle of the undercut structure of the first color film layer 140 is greater than the slope angle of the second color film layer 150. For example, the slope angle of the second color film layer 150 is 45°.

It is experimentally verified that the display panel of the embodiments of the present disclosure may mitigate the color separation, thereby mitigating the diffraction/interference fringes. According to the display panel of the embodiments of the present disclosure, an uniform hue may be achieved, and the absolute value of a*/b* may be reduced. For example, a* may be reduced from 6.0 to −0.4, and b* may be reduced from −11 to −5. The display panel of the embodiments of the present disclosure may also reduce the brightness of the viewing angle, so that the anti-peeping function may be implemented.

Figure 8A:
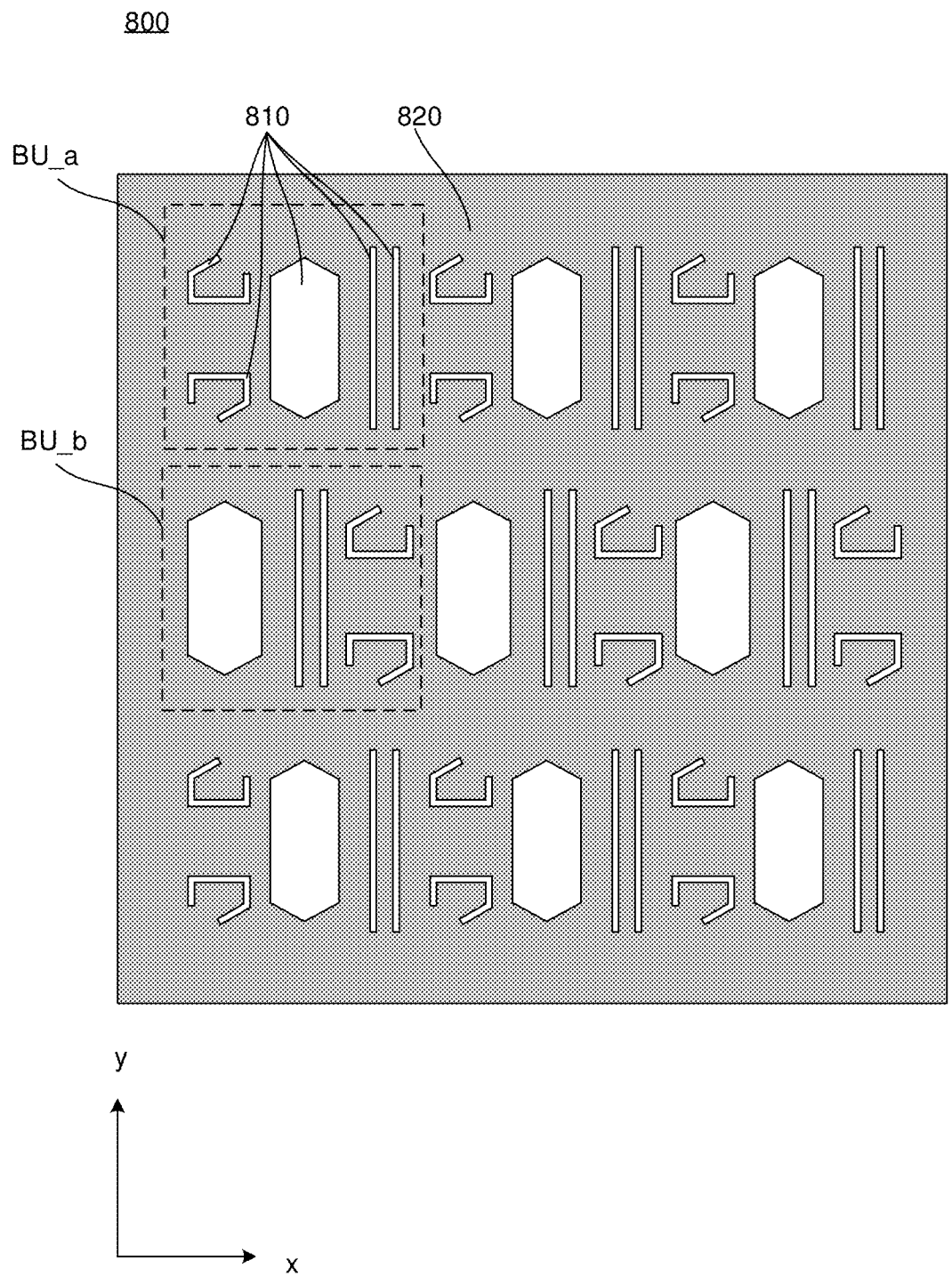
FIG. 8A shows a top view of a mask for manufacturing a blue color film according to the embodiments of the present disclosure.

FIG. 8A shows a top view of a mask for manufacturing a blue color film according to the embodiments of the present disclosure.

As shown by the dotted box in FIG. 8, the mask 800 includes a plurality of mask units arranged in an array, and each mask unit includes a plurality of light-transmitting areas 810 and a non-light-transmitting area 820 between the light-transmitting areas 810. Combined with the pixel layout in FIG. 1 and the structures of the color film in FIGS. 3 and 6, the mask unit of FIG. 8 may include a first mask unit BU_a and a second mask unit BU_b, which are respectively used to form the blue part of the color film in the structure of the color film shown in FIG. 3 or FIG. 6 for the two different pixel units Px1_a and Px1_b shown in FIG. 1.

Figure 8B:
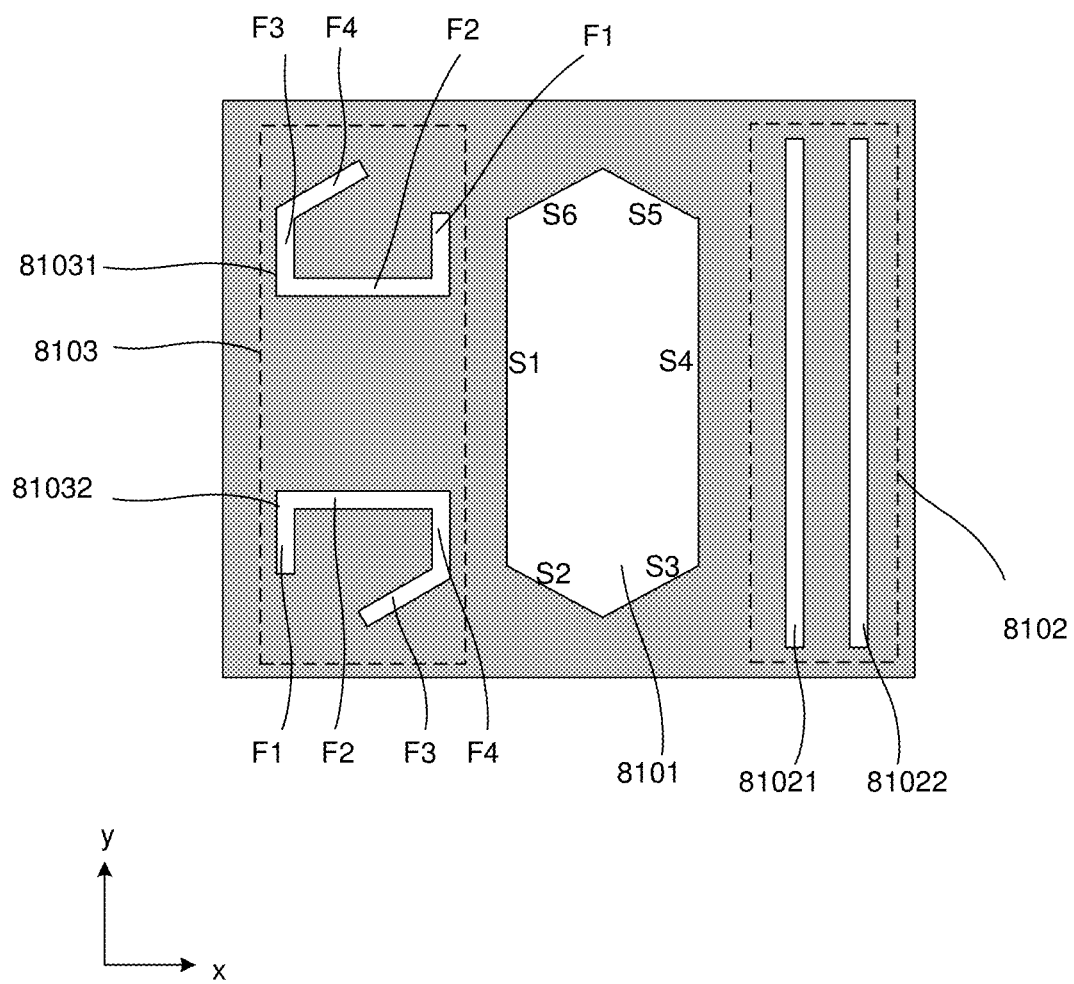
FIG. 8B shows an enlarged view of a first mask unit in FIG. 8A.

FIG. 8B shows an enlarged view of the first mask unit BU_a in FIG. 8A.

As shown in FIG. 8B, the mask unit BU_a includes a basic light-transmitting area 8101 and an overlay light-transmitting area. The basic light-transmitting area 8101 is used to form the basic unit of the predetermined color in the above-mentioned first color film layer, and the overlay light-transmitting area is used to form the overlay unit of the predetermined color in the above-mentioned second color film layer. In FIG. 8B, the basic light-transmitting area 8101 is used to form the blue basic unit in the above-mentioned first color film layer. Therefore, the overlay light-transmitting area includes a first overlay light-transmitting area 8102 and a second overlay light-transmitting area 8103, which are respectively used to form the first blue overlay unit and the second blue overlay unit in the second color film layer. The first overlay light-transmitting area 8102 and the second overlay light-transmitting area 8103 are respectively located on two sides of the basic light-transmitting area 8101 in the x direction (the first direction, that is, the row direction of the mask unit array).

The basic light-transmitting area 8101 has a shape of hexagonal, similar to the above-mentioned blue basic unit, and has the first edge S1 to the sixth edge S6 connected in sequence. The first overlay light-transmitting area 8102 includes a first strip portion 81021 and a second strip portion 81022 that are parallel to each other. The second overlay light-transmitting area 8103 includes a third strip portion 81031 and a fourth strip portion 81032. Each of the third strip portion and the fourth strip portion has a first sub-portion F1, a second sub-portion F2, a third sub-portion F3 and a fourth sub-portion F4 connected in sequence. The first sub-portion F1 and the third sub-portion F3 are parallel to each other. The second sub-portion F2 is perpendicular to the first sub-portion F1 and the third sub-portion F3. The fourth sub-portion F4 is inclined at a preset angle with respect to the third sub-portion F3. The fourth sub-portion F4 and the first sub-portion F3 are separated from each other. Corresponding to the above-mentioned third blue overlay unit and the fourth blue overlay unit respectively, a projection of the third strip portion 81031 on the substrate has a first pattern in an open loop shape, and a projection of the fourth strip portion 81032 on the substrate has a second pattern in an open loop shape. The second pattern may be an inversion pattern obtained which is obtained by inverting the first pattern twice, one time in the first direction (x direction) and the other time in the second direction (y direction).

Figure 8C:
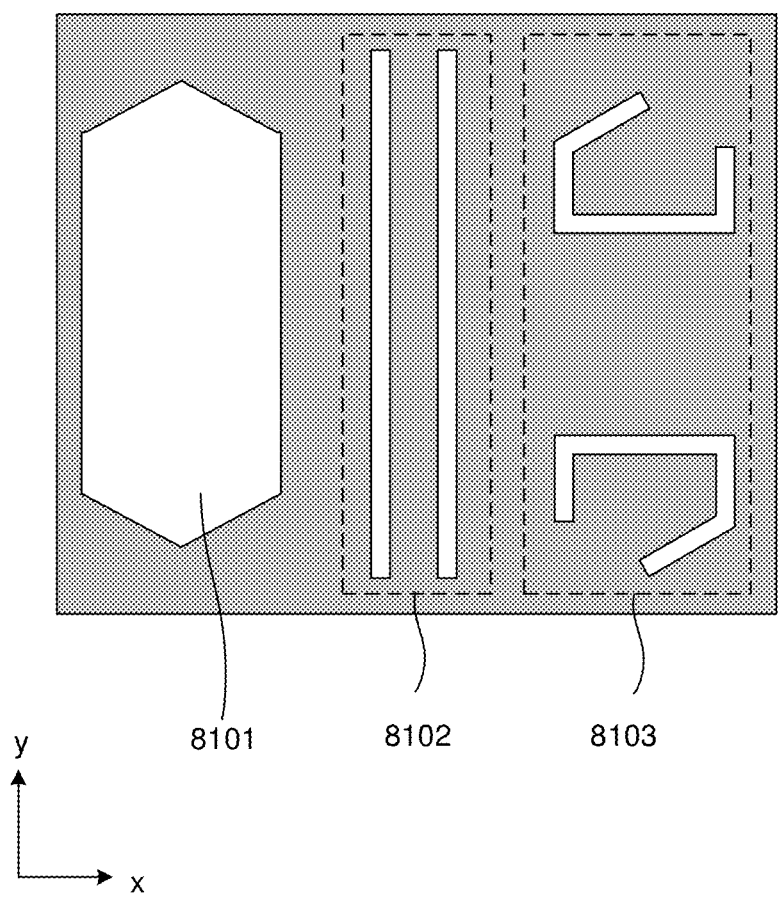
FIG. 8C shows an enlarged view of a second mask unit in FIG. 8A.

FIG. 8C shows an enlarged view of the second mask unit in FIG. 8A.

As shown in FIG. 8C, the structures of a basic light-transmitting area, a first overlay light-transmitting area and a second overlay light-transmitting area in the second mask unit BU_b are similar to those of the first mask unit BU_a. The difference is that the basic light-transmitting area 8101 and the second overlay light-transmitting area 8103 are respectively located on two sides of the first overlay light-transmitting area 8102 in the x-direction, so as to manufacture the part of the blue color film above the pixel unit Px1_b, which are not repeated here.

Figure 9:
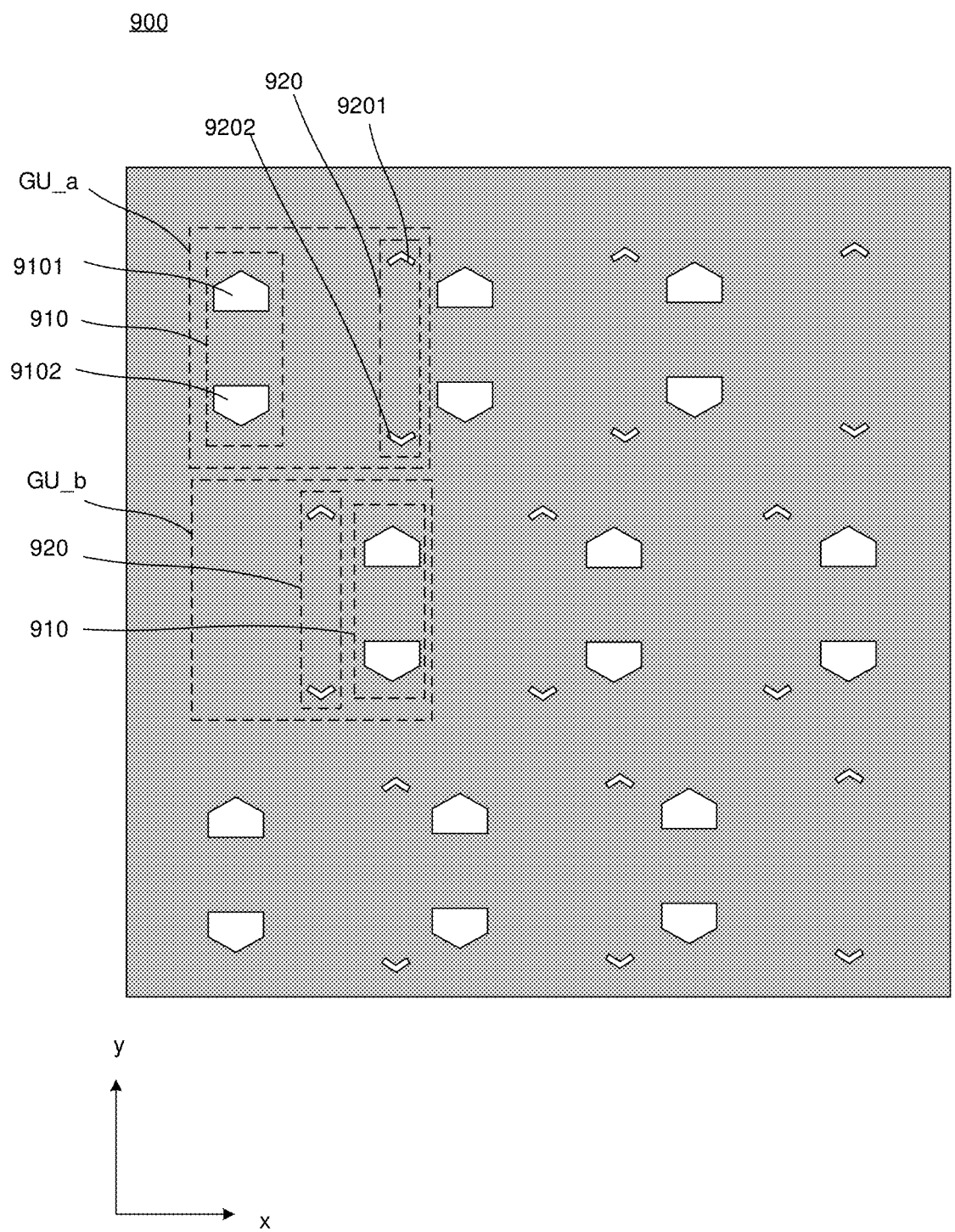
FIG. 9 shows a top view of a mask for manufacturing a green color film according to the embodiments of the present disclosure.

FIG. 9 shows a top view of a mask for manufacturing a green color film according to the embodiments of the present disclosure.

As shown in FIG. 9, similar to FIG. 8, the mask 900 may include a first mask unit GU_a and a second mask unit GU_b, which are respectively used to form the part of the green color film in the structure of the color film shown in FIG. 6 for two different pixel units Px1_a and Px1_b shown in FIG. 1.

The first mask unit GU_a includes a basic light-transmitting area 910 and an overlay light-transmitting area 920 which is located on a side of the basic light-transmitting area 910 in the x direction.

In the first mask unit GU_a, the basic light-transmitting area 910 is used to form the green basic unit in the first color film layer, and the overlay light-transmitting area 920 is used to form the green overlay unit in the second color film layer. For example, in FIG. 9, the basic light-transmitting area 910 includes a first basic light-transmitting area 9101 and a second basic light-transmitting area 9102. The shapes of the first basic light-transmitting area 9101 and the second basic light-transmitting area 9102 are basically the same as the projected shapes of the first green sub-portion CFG_1 and the second green sub-portion CF_G2 in the first color film layer on the substrate, respectively, such as the same shape of pentagon, so that the first basic light-transmitting area 9101 and the second basic light-transmitting area 9102 may be used to form the first green sub-portion CFG_1 and the second green sub-portion CF_G2, respectively.

The overlay light-transmitting area 920 of the first mask unit GU_a includes a first overlay light-transmitting area 9201 and a second overlay light-transmitting area 9202. The shapes of the first overlay light-transmitting area 9201 and the second overlay light-transmitting area 9202 are basically the same as the projection shapes of the first green overlay unit 1505 and the second green overlay unit 1506 in the second color film layer on the substrate, respectively, such as the same V-shaped, so that the first overlay light-transmitting area 9201 and the second overlay light-transmitting area 9202 may be used to form the first green overlay unit 1505 and the second green overlay unit 1506, respectively.

The structures of the basic light-transmitting area 910 and the overlay light-transmitting area 920 in the second mask unit GU_b are the similar to those of the mask unit GU_a. The difference is that, compared with the first mask unit GU_a, the distance between the overlay light-transmitting area 920 and the basic light-transmitting area 910 of the second mask unit GU_b in the x direction is smaller, in order to conform to the sub-pixel layout on the substrate. The distance between the overlay light-transmitting area 920 and the basic light-transmitting area 910 may refer to the smallest distance between various parts of the overlay light-transmitting area 920 and various parts of the basic light-transmitting area 910. The distance between a part of the overlay light-transmitting area 920 and a part of the basic light-transmitting area 910 may refer to the distance between the geometric centers of the parts, and may also refer to the distance between the edges of the parts. In other embodiments, the distance between the overlay light-transmitting area 920 and the basic light-transmitting area 910 may refer to the distance between the collection center of the overall pattern of the overlay light-transmitting area 920 and the collection center of the overall pattern of the basic light-transmitting area 910.

Figure 10:
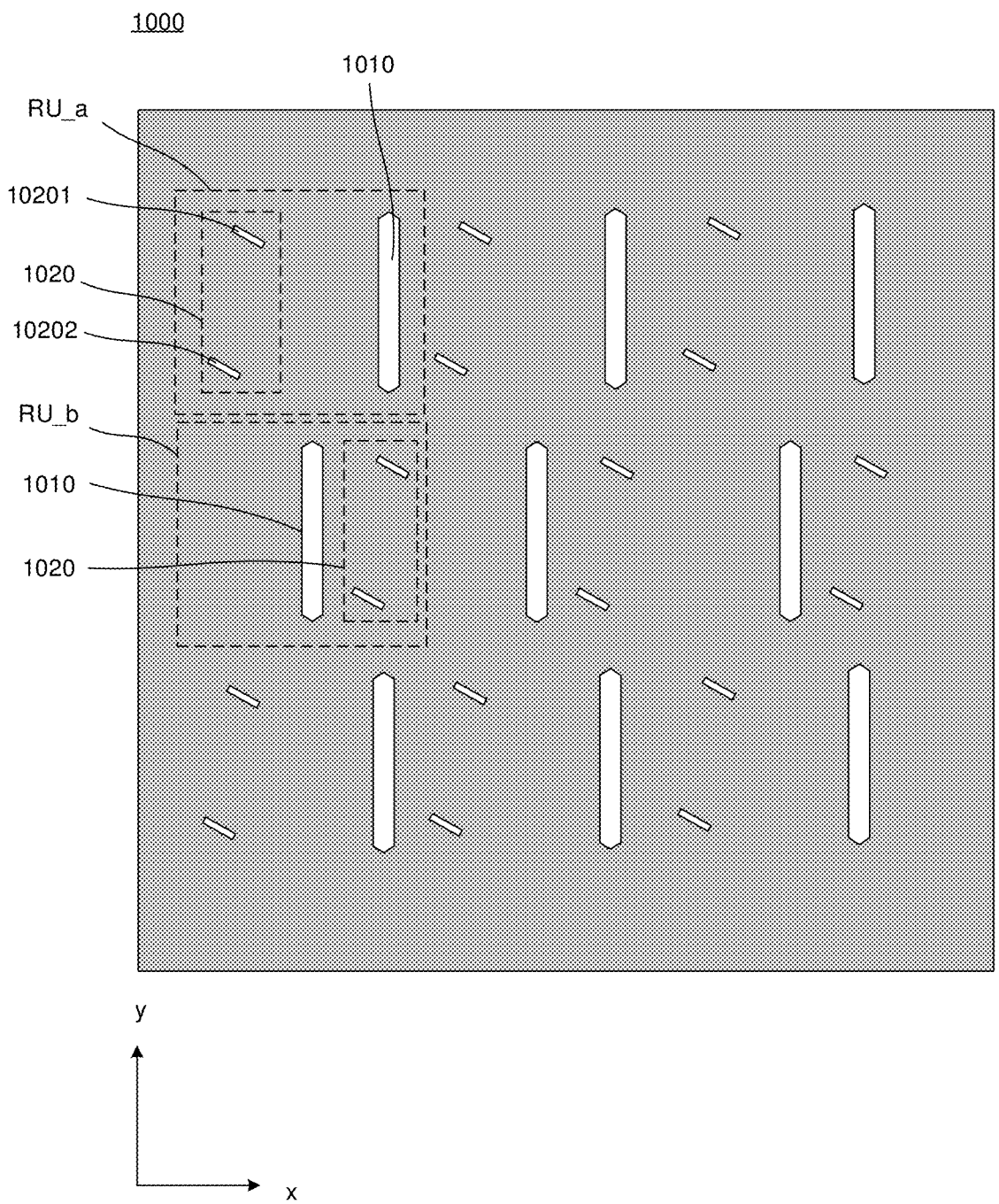
FIG. 10 shows a top view of a mask for manufacturing a red color film according to the embodiments of the present disclosure.

FIG. 10 shows a top view of a mask for manufacturing a red color film according to the embodiments of the present disclosure.

As shown in FIG. 10, similar to FIG. 9, the mask unit 1000 may include a first mask unit RU_a and a second mask unit RU_b, which are respectively used to form the part of the red color film in the structure of the color film shown in FIG. 6 for two different pixel units Px1_a and Px1_b shown in FIG. 1.

The first mask unit RU_a includes a basic light-transmitting 1010 and an overlay light-transmitting area 1020, and the overlay light-transmitting area 1020 is located on a side of the basic light-transmitting 1010 in the x-direction.

In the first mask unit RU_a, the basic light-transmitting area 1010 is used to form the red basic unit in the first color film layer, and the overlay light-transmitting area 1020 is used to form the red overlay unit in the second color film layer. For example, in FIG. 10, the shape of the basic light-transmitting area 1010 is basically the same as the projected shape of the red basic unit CF_R in the first color film layer on the substrate, such as the same shape of hexagonal, so that the basic light-transmitting area 1010 may be used to form the red basic unit CF_R.

The overlay light-transmitting area 1020 in the first mask unit RU_a includes a first overlay light-transmitting area 10201 and a second overlay light-transmitting area 10202. The shapes of the first overlay light-transmitting area 10201 and the second overlay light-transmitting area 10202 are substantially the same as the projection shapes of the first red overlay unit 1507 and the second red overlay unit 1508 in the second color film layer on the substrate respectively. For example, each of the first overlay light-transmitting area 10201 and the second overlay light-transmitting area 10202 may have a shape of strip inclined at a preset angle with respect to the x-direction, so that the first overlay light-transmitting area 9201 and the second overlay light-transmitting area 9202 may be used to form the first red overlay unit 1507 and the second red overlay unit 1508, respectively.

The structures of the basic light-transmitting area 1010 and the overlay light-transmitting area 1020 in the second mask unit RU_b are the same as those of the mask unit RU_a. The difference is that compared with the first mask unit RU_a, a distance between the overlay light-transmitting area 1020 and the basic light-transmitting area 1010 in the second mask unit RU_b in the x direction is smaller, in order to conform to the sub-pixel layout on the substrate.

By using the above-mentioned masks 800, 900 and 1000, the structure of the color film shown in FIG. 6 may be formed for the pixel layout shown in FIG. 1. For example, referring to FIG. 2, the plurality of sub-pixels R, G and B may be formed on the substrate 110, and then the encapsulation layer 120 is formed to cover the plurality of sub-pixels R, G and B. The light shielding layer 130 is formed on the encapsulation layer 120. A red photosensitive material layer is formed on the light shielding layer 130, and the red basic unit in the first color film layer 140 and the red overlay unit in the second color film layer 150 are formed through the exposure and highlighting processes using the mask 1000. Then, a green photosensitive material layer is formed on the light-shielding layer 130, and the green basic unit in the first color film layer 140 and the green overlay unit in the second color film layer 150 are formed through exposure and highlighting processes using the mask 900. Then, a blue photosensitive material layer is formed on the light-shielding layer 130, and the blue basic unit in the first color film layer 140 and the blue overlay unit in the second color film layer 150 are formed through exposure and highlighting processes using the mask 800. In this way, the patterns of the first color film layer and the second color film layer as shown in FIG. 6 are obtained. Then, the formed overall structure is obtained by covering a cover plate 160. It should be noted that, in the embodiments of the present disclosure, three masks is used to implement the above-mentioned overlay color film layer without adding additional masks.

Figure 11A:
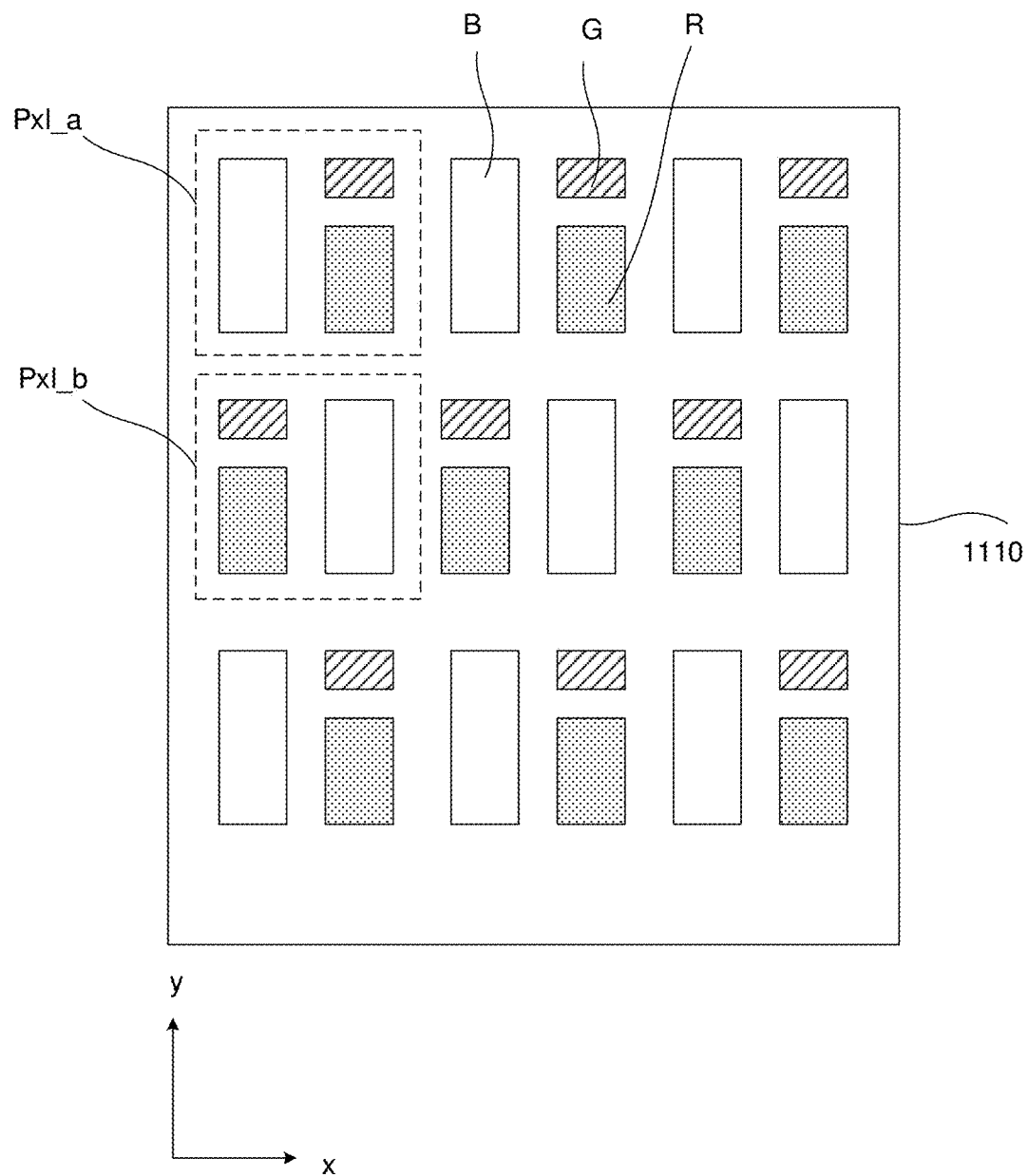
FIGS. 11A, 11B and 11C respectively show pixel layout diagrams of a display panel according to other embodiments of the present disclosure.
Figure 11B:
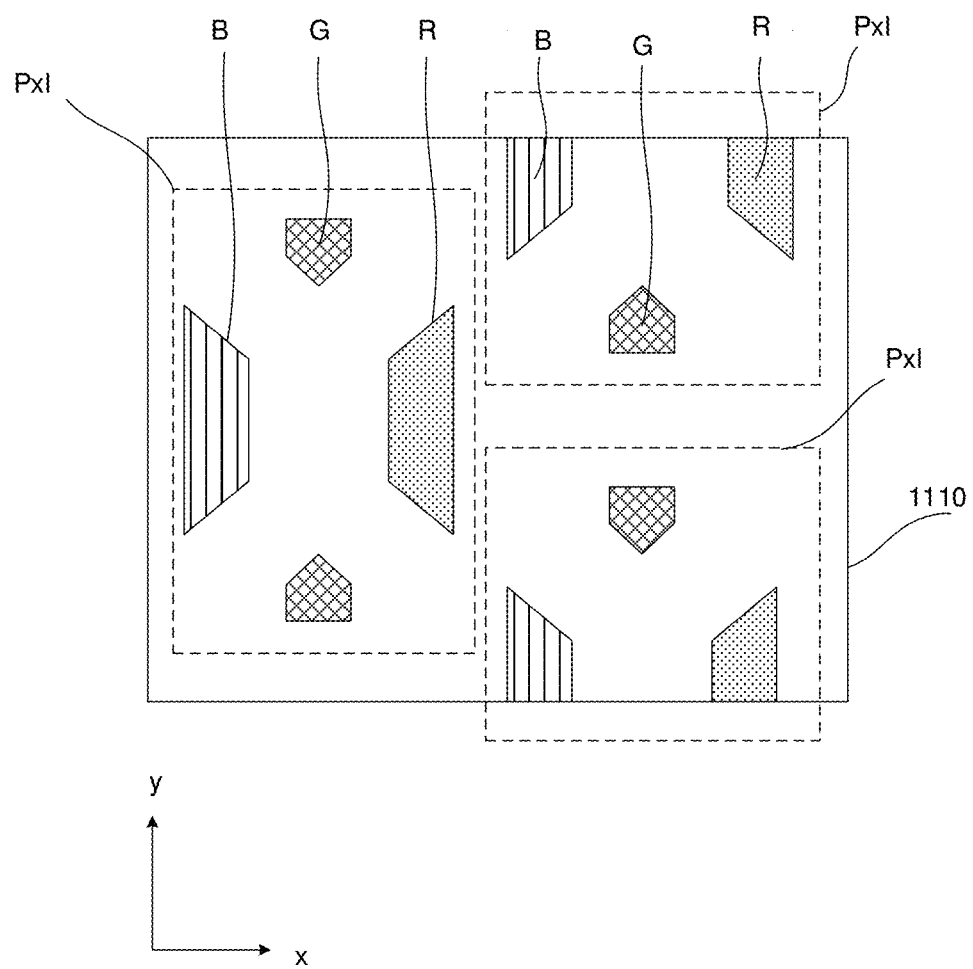
Figure 11C:
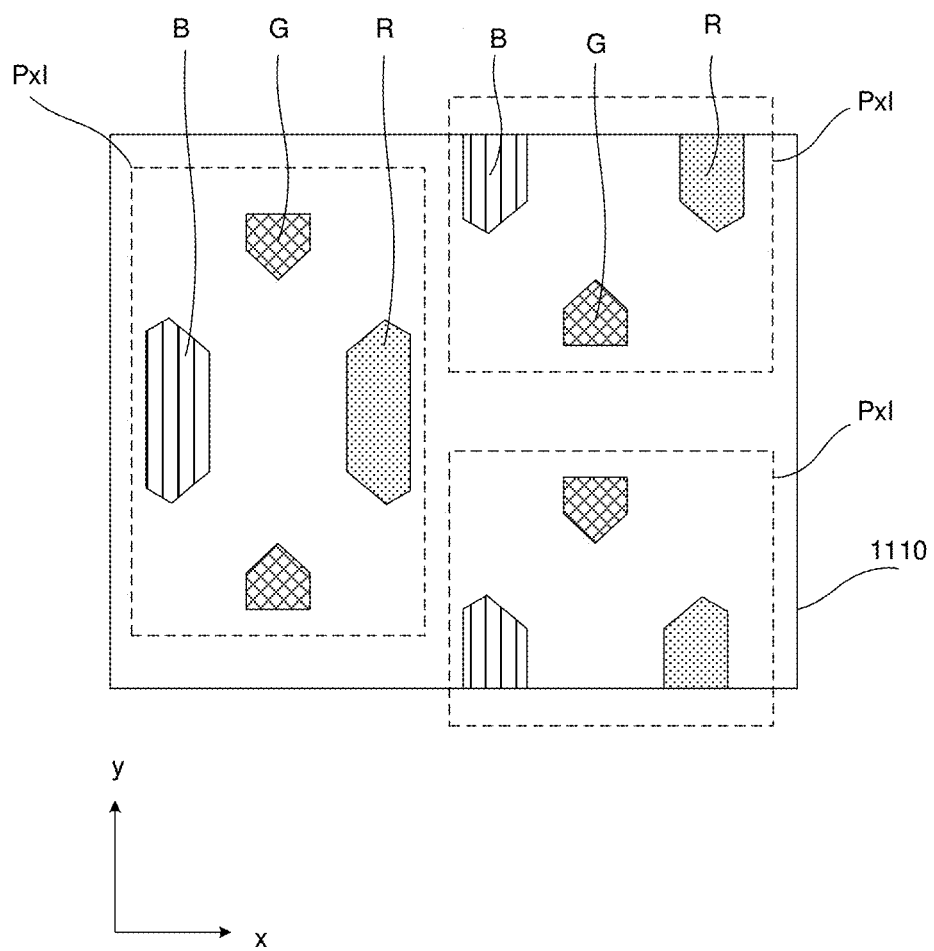

Although the structure of the color film layer is described based on the pixel layout described in FIG. 1 in the above embodiments, the embodiments of the present disclosure are not limited thereto. The embodiments of the present disclosure are applicable to any other pixel layouts, such as the pixel layouts shown in FIGS. 11A, 11B, and 11C. In FIG. 11A, a display panel includes a substrate 1110 and pixel units Px1_a and Px1_b arranged in an array on the substrate 1110, each pixel unit including a red sub-pixel R, a green sub-pixel G, and a blue sub-pixel B. The red sub-pixel R and the green sub-pixel G are located on a side of the blue sub-pixel B in the x direction, and the red sub-pixel R and the green sub-pixel G are arranged in a column in the y direction. Each of the red sub-pixel R, the green sub-pixel G and the blue sub-pixel B has a projection of rectangular shape on the substrate 1110. An area of the projection of the red sub-pixel R is larger than an area of the projection of the green sub-pixel G, and an area of the projection of the blue sub-pixel B is larger than an area of the projection of the red sub-pixel R. In FIG. 11B, a display panel includes a substrate 1110 and pixel units Px1 arranged in an array on the substrate 1110, and each pixel unit Px1 includes a red sub-pixel R, a green sub-pixel G and a blue sub-pixel B. The green sub-pixel G includes a first green sub-pixel and a second green sub-pixel (collectively denoted by G) which are arranged in the y-direction. In the pixel unit Px1, the blue sub-pixel B and the red sub-pixel R are located on two sides of the green sub-pixel G in the x direction. Any two adjacent columns of pixel units Px1 are shifted in the y direction relative to each other. In FIG. 11B, projections of the blue sub-pixel B and the red sub-pixel R on the substrate 1110 have a shape of trapezoid and are symmetrical with respect to the y direction, and projections of the first green sub-pixel and the second green sub-pixel G on the substrate 1110 have a shape of pentagon and are symmetrical with respect to the x-direction. A display panel in FIG. 11C is similar to that of FIG. 11B, the difference is that projections of a red sub-pixels R and a blue sub-pixels B on a substrate 1110 have a shape of hexagon instead of trapezoid.

Figure 12:
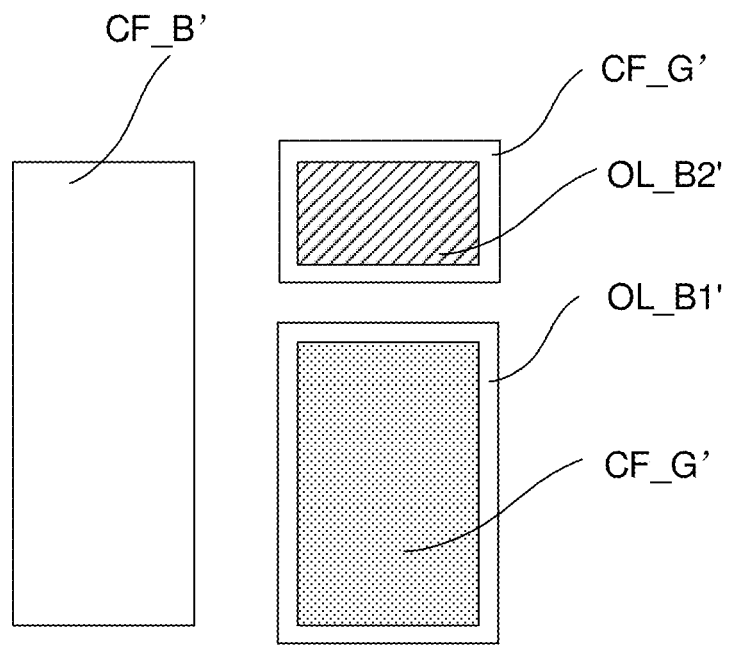
FIG. 12 shows a structure diagram of a color film for a pixel unit im a pixel layout of FIG. 11A.

For the pixel layout of FIG. 11A, as shown in FIG. 12, a red basic unit CF_R', a green basic unit CF_G' and a blue basic unit CF_B' in a first color film layer adopt the same arrangement as the sub-pixels R, G, B. Projections of the basic units CF_R', CF_G' and CF_B' on the substrate are all rectangles, and covers projections of opening areas of the sub-pixels R, G, and B on the substrate, respectively. A second color film layer includes a first blue overlay unit OL_B1' and a second blue overlay unit OL_B2'. At least a part of the first blue overlay unit OL_B1' covers all four edges of the green basic unit CF_G', and at least a part of the second blue overlay unit OL_B2' covers all four edges of the red basic unit CF_R'. Similarly, for the pixel layouts of FIGS. 11B and 11C, red, green and blue basic units in a first color film layer may use the same layout and projection shape as the red, green, and blue sub-pixels, respectively. Overlay units in a second color film layer may cover one or more basic units in the first color film layer as required. For example, for the pixel layout of FIG. 11B, the projection of the red basic unit in the first color film layer on the substrate 1110 may also have a shape of trapezoid, and four sides of the trapezoid correspond to four edges of the red basic unit. In this case that the blue overlay unit is used to to cover two edges of the red basic unit that are parallel to each other, or to cover three of the four edges of the red basic unit. The green basic unit may be covered by the blue overlay unit in a similar manner, which will not be repeated here.

Figure 13:
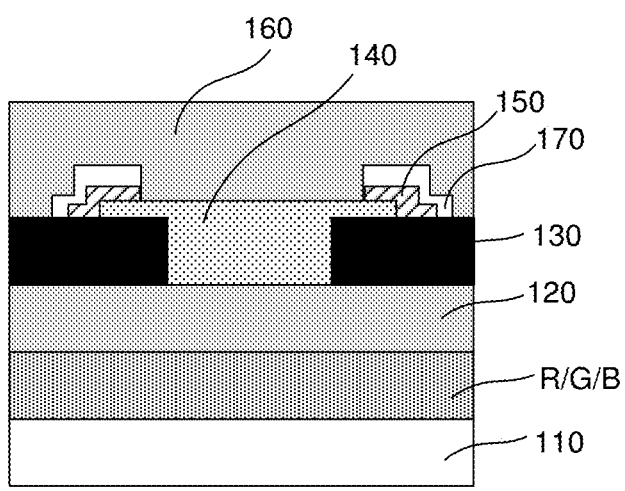
FIG. 13 illustrates a cross-sectional view of a display panel according to another embodiment of the present disclosure.

Although the above embodiments are described by taking a single-layer second color film layer covering a first color film layer as an example, the embodiments of the present disclosure are not limited thereto. In some embodiments, a second color film layer may be overlay on a first color film layer by other overlaying methods as required. In other embodiments, other color film layers may be additionally covered on a second color film layer. For example, as shown in FIG. 13, a third color film layer 170 may also be overlay on at least a part of a second color film layer 150. In some embodiments, a basic unit and the second color film layer and the third color film layer above may have different in color. For example, a green overlay unit in the second color film layer 150 covers at least a part of an edge of a red basic unit in the first color film layer 140, a red overlay unit in the second color film layer 150 covers at least a part of an edge of a green basic unit in the first color film layer 140, a first blue overlay unit in the third color film layer 170 covers the green overlay unit in the second color film layer 150, and a second blue overlay unit in the third color film layer 170 covers the red overlay unit in the second color film layer 150.

It should be noted that, in the above description, the technical solutions of the embodiments of the present disclosure are shown only by way of example, but it does not mean that the embodiments of the present disclosure are limited to the above steps and structures. Where possible, steps and structures may be adjusted and selected as needed. Therefore, some steps and units are not necessary elements for implementing the general inventive concept of the embodiments of the present disclosure.

The present disclosure has thus far been described in connection with the preferred embodiments. It should be understood that various other changes, substitutions and additions can be made by those skilled in the art without departing from the spirit and scope of the embodiments of the present disclosure. Therefore, the scope of the embodiments of the present disclosure should not be limited to the specific embodiments described above, but should be defined by the appended claims.

What is claimed is:

1. A display panel, comprising:
a substrate,
a plurality of sub-pixels on a side of the substrate;
an encapsulation layer on a side of the plurality of sub-pixels away from the substrate, wherein the encapsulation layer covers the plurality of sub-pixels;
a light shielding layer on a side of the encapsulation layer away from the substrate, wherein the light shielding layer is provided with a plurality of openings corresponding to the plurality of sub-pixels respectively;
a first color film layer comprising a plurality of basic units covering the plurality of openings in the light shielding layer respectively; and
a second color film layer on a side of the first color film layer away from the substrate, wherein the second color film layer comprises a plurality of overlay units covering an edge of at least one basic unit of the plurality of basic units respectively, wherein a color of the basic unit is different form a color of the overlay unit covering the basic unit;
wherein the plurality of basic units comprises at least one red basic unit, at least one green basic unit and at least one blue basic unit, and the plurality of overlay units comprises at least one first blue overlay unit corresponding to the at least one red basic unit respectively and at least one second blue overlay unit corresponding to the at least one green basic unit respectively;
wherein at least a part of an edge of the red basic unit is covered by the first blue overlay unit corresponding to the red basic unit; and
wherein at least a part of an edge of the green basic unit is covered by the second blue overlay unit corresponding to the green basic unit.

2. The display panel according to claim 1, wherein,
a projection of the red basic unit on the substrate has a shape of a polygon, the red basic unit comprises a plurality of edges connected in sequence, and two edges of the plurality of edges are parallel to each other; and
the first blue overlay unit comprises a first blue sub-unit and a second blue sub-unit, and the first blue overlay unit covers two edges of the red basic unit which are parallel to each other.

3. The display panel according to claim 2, wherein,
the projection of the red basic unit on the substrate has a shape of a hexagon, and the red basic unit has a first edge, a second edge, a third edge, a fourth edge, a fifth edge and a sixth edge connected in sequence, wherein the first edge and the fourth edge are parallel to each other and have a first length, and the second edge, the third edge, the fifth edge and the sixth edge have a second length less than the first length; and
the first blue overlay unit comprises the first blue sub-unit and the second blue sub-unit, the first blue sub-unit covers the first edge of the red basic unit, and the second blue sub-unit covers the fourth edge of the red basic unit.

4. The display panel according to claim 3, wherein the plurality of overlay units further comprises at least one green overlay unit corresponding to the at least one red basic unit respectively, the green overlay unit comprises a first green overlay unit and a second green overlay unit, the first green overlay unit covers the second edge and the third edge of the red basic unit, and the second green overlay unit covers the fifth edge and the sixth edge of the red basic unit.

5. The display panel according to claim 3, wherein,
the first blue sub-unit extends along the first edge of the red basic unit in a strip shape, and at least a part of the first blue sub-unit covers the first edge of the red basic unit; and
the second blue sub-unit extends along the fourth edge of the red basic unit in a strip shape, and at least a part of the second blue sub-unit covers the fourth edge of the red basic unit.

6. The display panel according to claim 5, wherein,
the first blue sub-unit has a width in a range of 3 μm to 10 μm in a direction perpendicular to an extending direction of the first blue sub-unit, and a part of the first blue sub-unit covering the red basic unit has a width in a range of 1 μm to 8 μm in the direction perpendicular to the extending direction of the first blue sub-unit;
the second blue sub-unit has a width in a range of 3 μm to 10 μm in a direction perpendicular to an extending direction of the second blue sub-unit, and a part of the second blue sub-unit covering the red basic unit has a width perpendicular to the extending direction in a range of 1 μm to 8 μm.

7. The display panel of claim 1, wherein the green basic unit comprises a first green sub-portion and a second green sub-portion, each of a projection of the first green sub-portion on the substrate and a projection of the second green sub-portion on the substrate has a shape of pentagons, and each of the first green sub-portion and the second green sub-portion has a first edge, a second edge, a third edge, a fourth edge and a fifth edge connected in sequence, and wherein the second blue overlay unit comprises a third blue sub-unit and a fourth blue sub-unit, the third blue sub-unit covers at least one of the first edge, the second edge, the third edge, the fourth edge and the fifth edge of the first green sub-portion, and the fourth blue sub-unit covers at least one of the first edge, the second edge, the third edge, the fourth edge and the fifth edge of the second green sub-portion.

8. The display panel according to claim 7, wherein, in each of the first green sub-portion and the second green sub-portion, the first edge and the third edge are parallel, the second edge is perpendicular to the first edge and the third edge, and an angle between the fourth edge and the third edge is equal to an angle between the fifth edge and the first edge;

the first green sub-portion and the second green sub-portion are mirrored to each other, so that the second edge of the first green sub-portion is adjacent to the second edge of the second sub-portion, the third edge, the fourth edge and the fifth edge of the first green sub-portion are located on a side of the second edge of the first green sub-portion away from the second green sub-portion, and the third edge, the fourth edge and the fifth edge of the second green sub-portion are located on a side of the second edge of the second green sub-portion away from the first green sub-portion; and the third blue sub-unit covers the first edge, the second edge, the third edge and the fifth edge of the first green sub-portion, and the fourth blue sub-unit covers the first edge, the second edge, the third edge and the fourth edge of the second green sub-portion.

9. The display panel according to claim 8, wherein the plurality of overlay units further comprises at least one red overlay unit corresponding to the at least one green basic unit respectively, the red overlay unit comprises a first red overlay unit and a second red overlay unit, the first red overlay unit covers the fourth edge of the first green sub-portion of the green basic unit, and the second red overlay unit covers the fifth edge of the second green sub-portion of the green basic unit.

10. The display panel according to claim 8, wherein, the third blue sub-unit extends along the first edge, the second edge, the third edge and the fifth edge of the first green sub-portion in a strip shape, and at least a part of the third blue sub-unit covers the first edge, the second edge, the third edge and the fifth edge of the first green sub-portion; and the fourth blue sub-unit extends along the first edge, the second edge, the third edge and the fourth edge of the second green sub-portion in a strip shape, and at least a part of the fourth blue sub-unit covers the first edge, the second edge, the third edge and the fourth edge of the second green sub-portion.

11. The display panel according to claim 10, wherein, the third blue sub-unit has a width in a range of 3 μm to 10 μm in a direction perpendicular to an extending direction of the third blue sub-unit, and a part of the third blue sub-unit covering the first green sub-portion has a width in a range of 1 μm to 8 μm in a direction perpendicular to the extending direction of the third blue sub-unit; and the fourth blue sub-unit has a width in a range of 3 μm to 10 μm in a direction perpendicular to an extending direction of the fourth blue sub-unit, and a part of the fourth blue sub-unit covering the second green sub-portion has a width in a range of 1 μm to 8 μm in a direction perpendicular to the extending direction of the fourth blue sub-unit.

12. The display panel according to claim 1, wherein the blue basic unit is not covered by any overlay unit.

13. The display panel according to claim 1, wherein a part of the overlay unit covers an edge of the basic unit, and another part of the overlay unit is in contact with a surface of the light shielding layer on a side of the light shielding layer away from the substrate.

14. The display panel according to claim 1, wherein the plurality of sub-pixels are divided into a plurality of pixel units arranged in an array, and each of the plurality of pixel units comprises a red sub-pixel, a green sub-pixel and a blue sub-pixel, and wherein the red basic unit is located on a side of the red sub-pixel away from the substrate, the green basic unit is located on a side of the green sub-pixel away from the substrate, and the blue basic unit is located on a side of the blue sub-pixel away from the substrate.

15. The display panel according to claim 14, wherein the green sub-pixel comprises a first green sub-pixel and a second green sub-pixel, and the green basic unit comprises a first green sub-portion and a second green sub-portion, and wherein the first green sub-portion is located on a side of the first green sub-pixel away from the substrate, and the second green sub-portion is located on a side of the second green sub-pixel away from the substrate.

16. The display panel according to claim 15, wherein the plurality of pixel units comprises at least one first pixel unit and at least one second pixel unit, wherein, in the first pixel unit, the red sub-pixel, the green sub-pixel and the blue sub-pixel are arranged in a first direction, the green sub-pixel and the red sub-pixel are respectively located on two sides of the blue sub-pixel in the first direction, and the first green sub-pixel and the second green sub-pixel of the green sub-pixel are arranged in a second direction, wherein the first direction is a row direction of the array, and the second direction is a column direction of the array;

in the second pixel unit, the red sub-pixel, the green sub-pixel and the blue sub-pixel are arranged in the first direction, the blue sub-pixel and the green sub-pixel are respectively located on two sides of the red sub-pixel in the first direction, and the first green sub-pixel and the second green sub-pixel of the green sub-pixel are arranged in the second direction; and the pixel units located in the same row are first pixel units or second pixel units, and any two adjacent pixel units of the pixel units located in the same column are first pixel unit and second pixel unit respectively.

17. The display panel according to claim 1, further comprising: a cover plate on a side of the second layer away from the substrate.

18. The display panel according to claim 1, further comprising: a touch layer between the encapsulation layer and the light shielding layer.

19. The display panel according to claim 1, wherein at least one of the plurality of sub-pixels comprises:

a pixel driving circuit on a side of the substrate facing the light shielding layer;

a planarization layer on a side of the pixel driving circuit away from the substrate;

an anode on a side of the planarization layer away from the substrate, wherein the anode is connected to the pixel driving circuit through a via hole in the planarization layer;

a pixel defining layer on a side of the planarization layer away from the substrate, wherein the pixel defining layer covers an edge of the anode;

a light-emitting layer on a side of the anode away from the substrate; and a cathode on a side of the light-emitting layer away from the substrate, wherein the encapsulation layer is located on a side of the cathode away from the substrate.

20. A display panel, comprising:

a substrate, a plurality of sub-pixels on a side of the substrate;

an encapsulation layer on a side of the plurality of sub-pixels away from the substrate, wherein the encapsulation layer covers the plurality of sub-pixels;

a light shielding layer on a side of the encapsulation layer away from the substrate, wherein the light shielding layer is provided with a plurality of openings corresponding to the plurality of sub-pixels respectively;

a first color film layer comprising a plurality of basic units covering the plurality of openings in the light shielding layer respectively; and a second color film layer on a side of the first color film layer away from the substrate, wherein the second color film layer comprises a plurality of overlay units;

wherein the plurality of basic units comprise a first basic unit with a first color, a second basic unit with a second color, and a third basic unit with a third color, wherein the third color is different from the first color and the second color;

wherein the plurality of overlay units comprise a first overlay unit and a second overlay unit, the first overlay unit and the second overlay unit have a third color;

wherein the first overlay unit covers a part of the edge of the first basic unit, and the second overlay unit covers a part of the edge of the second basic unit;

wherein the plurality of overlay units further comprise a third overlay unit with a second color and/or a fourth overlay unit with a first color, wherein the third overlay unit covers another part of the edge of the first basic unit, and the fourth overlay unit covers another part of the edge of the second basic unit; and wherein, the first color is one of red and green, the second color is the other of red and green, and the third color is blue;

the first color is one of green and blue, the second color is the other of green and blue, and the third color is red;

the first color is one of blue and red, the second color is the other of blue and red, and the third color is green;

the first and second colors are blue, and the third color is green; or the first and second colors are red, and the third color is green.

* * * * *